(12) United States Patent
Lin et al.

(10) Patent No.: US 12,302,615 B2
(45) Date of Patent: May 13, 2025

(54) EPITAXIAL STRUCTURES EXPOSED IN AIRGAPS FOR SEMICONDUCTOR DEVICES

(71) Applicant: Taiwan Semiconductor Manufacturing Company, Ltd., Hsin-Chu (TW)

(72) Inventors: Po-Yu Lin, New Taipei (TW); Wei-Yang Lee, Taipei (TW); Chia-Pin Lin, Hsinchu County (TW); Tzu-Hua Chiu, Hsinchu (TW); Kuan-Hao Cheng, Hsinchu (TW); Wei-Han Fan, Hsin-Chu (TW); Li-Li Su, HsinChu County (TW); Wei-Min Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/434,914

(22) Filed: Feb. 7, 2024

(65) Prior Publication Data
US 2024/0186373 A1    Jun. 6, 2024

Related U.S. Application Data

(62) Division of application No. 17/394,668, filed on Aug. 5, 2021, now Pat. No. 11,923,409.
(Continued)

(51) Int. Cl.
*H01L 29/06* (2006.01)
*H01L 21/02* (2006.01)
*H01L 21/306* (2006.01)
*H01L 29/423* (2006.01)
*H01L 29/66* (2006.01)
*H01L 29/786* (2006.01)
(Continued)

(52) U.S. Cl.
CPC ......... *H10D 62/116* (2025.01); *H10D 30/031* (2025.01); *H10D 30/6757* (2025.01); *H10D 64/018* (2025.01); *H01L 21/02532* (2013.01); *H01L 21/02639* (2013.01); *H01L 21/30604* (2013.01); *H10D 30/6735* (2025.01); *H10D 62/118* (2025.01)

(58) Field of Classification Search
CPC ........... H01L 29/0653; H01L 29/66553; H01L 29/66742; H01L 29/78696; H01L 21/02532; H01L 21/02639; H01L 21/30604; H01L 29/0665; H01L 29/42392
See application file for complete search history.

(56) References Cited

U.S. PATENT DOCUMENTS 9,691,850 B2 * 6/2017 Cheng ............... H01L 29/78696
9,954,058 B1 * 4/2018 Mochizuki ........ H01L 29/42392
(Continued)

*Primary Examiner* — Thao X Le
*Assistant Examiner* — Sean Ayers Winters
(74) *Attorney, Agent, or Firm* — HAYNES AND BOONE, LLP

(57) ABSTRACT

A semiconductor device includes a source/drain feature over a semiconductor substrate, channel layers over the semiconductor substrate and connected to the source/drain feature, a gate portion between vertically adjacent channel layers, and an inner spacer between the source/drain feature and the gate portion and between adjacent channel layers. The semiconductor device further includes an air gap between the inner spacer and the source/drain feature.

20 Claims, 17 Drawing Sheets

Related U.S. Application Data

(60) Provisional application No. 63/168,479, filed on Mar. 31, 2021.

(51) Int. Cl.
 *H10D 30/01* (2025.01)
 *H10D 30/67* (2025.01)
 *H10D 62/10* (2025.01)
 *H10D 64/01* (2025.01)

(56) References Cited

U.S. PATENT DOCUMENTS

| | | | |
|---|---|---|---|
| 2017/0250261 A1* | 8/2017 | Kim | H01L 29/78696 |
| 2018/0175046 A1* | 6/2018 | Chiou | H01L 29/7848 |
| 2018/0286962 A1* | 10/2018 | Bao | H01L 29/6659 |
| 2020/0052086 A1* | 2/2020 | Yang | H01L 29/4991 |
| 2020/0411667 A1* | 12/2020 | Wong | H01L 29/0653 |
| 2021/0036122 A1* | 2/2021 | Wong | B82Y 10/00 |

\* cited by examiner

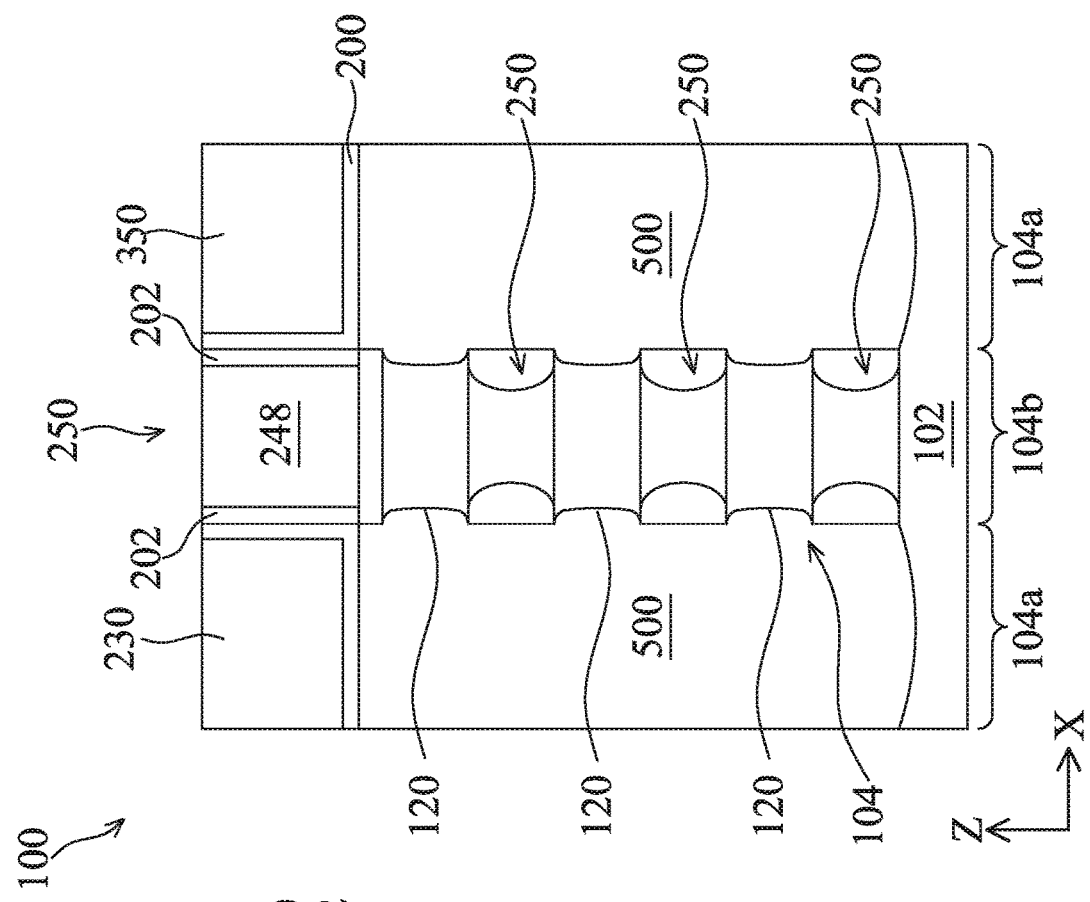
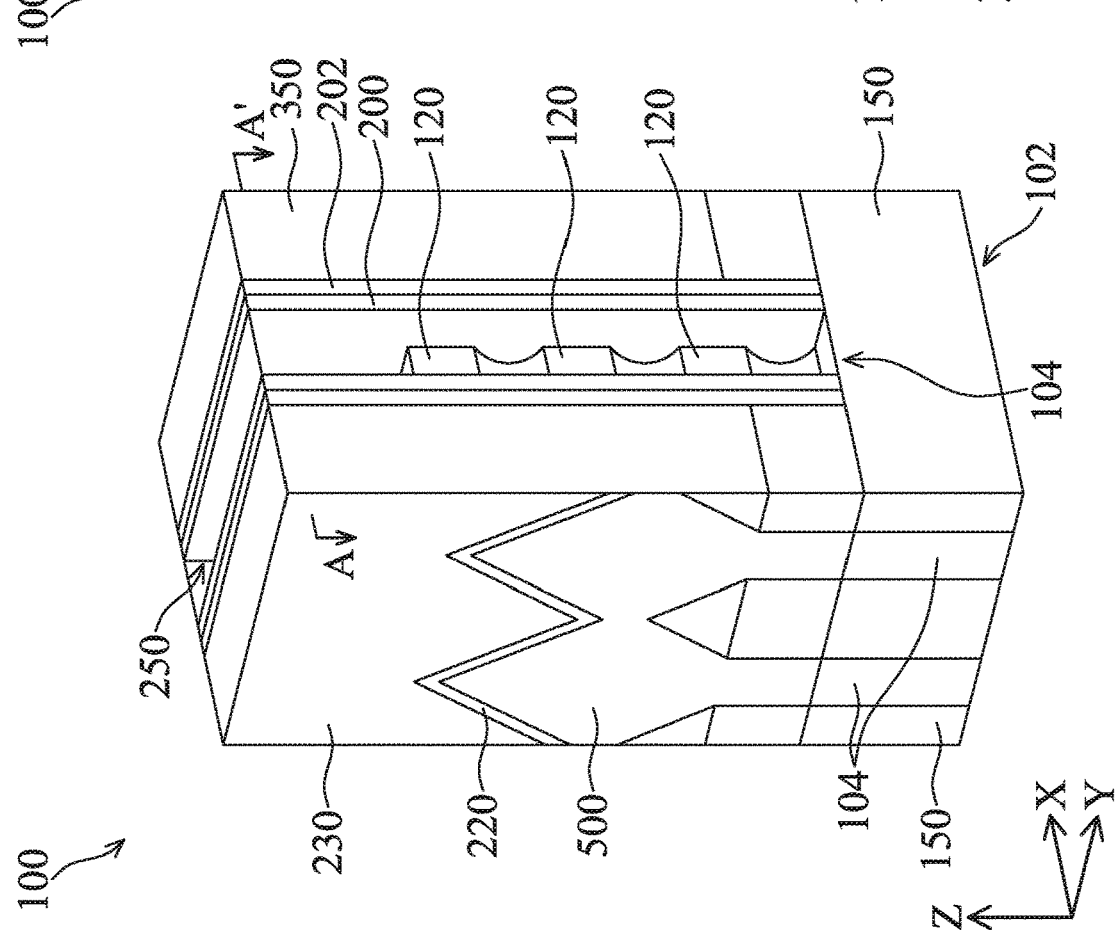
FIG. 1B
FIG. 1A

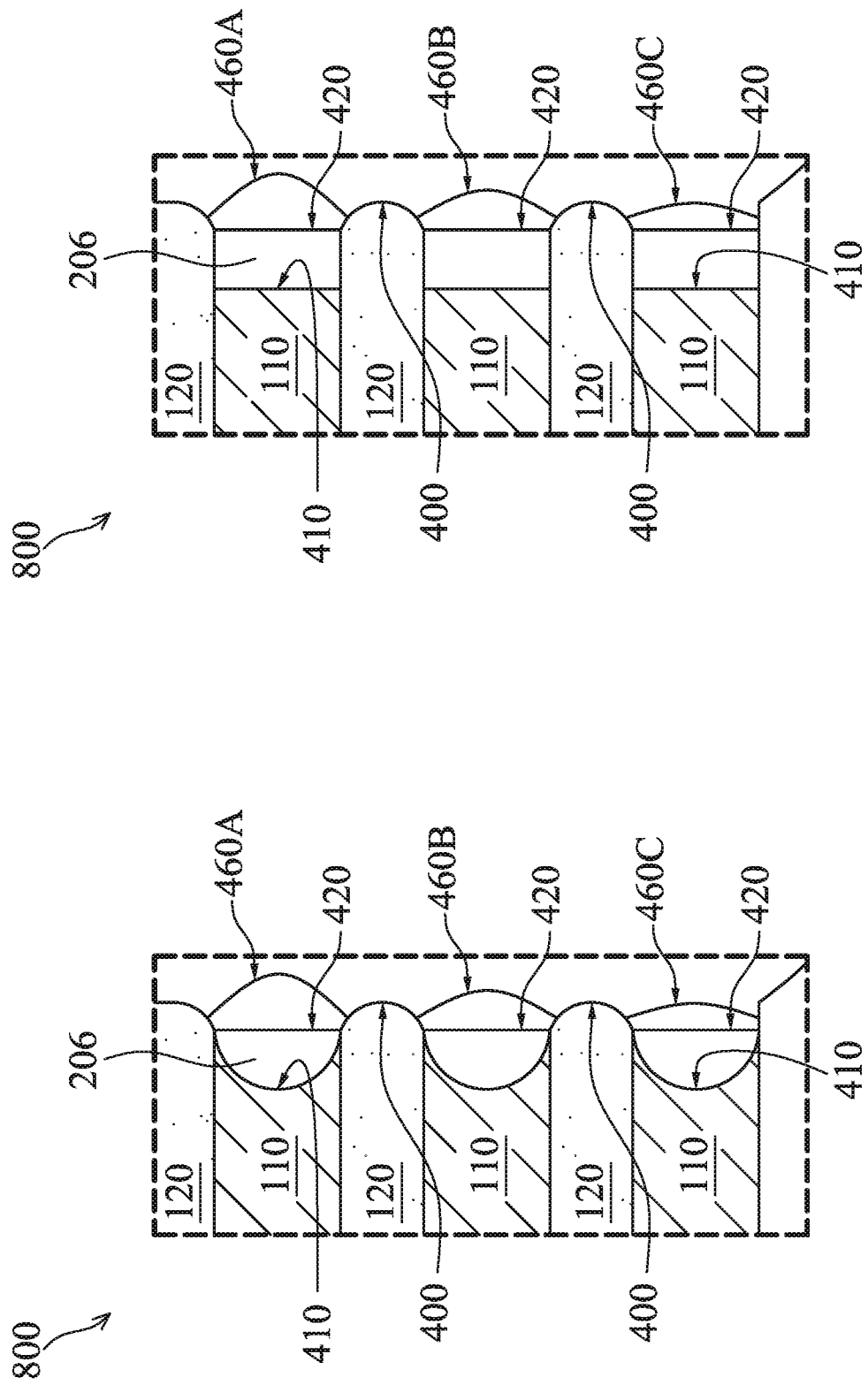

EPITAXIAL STRUCTURES EXPOSED IN AIRGAPS FOR SEMICONDUCTOR DEVICES

PRIORITY DATA

This is a divisional application of U.S. application Ser. No. 17/394,668, filed Aug. 5, 2021, which claims priority to U.S. Provisional Application No. 63/168,479, filed Mar. 31, 2021, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is nanosheet-based transistor, whose gate structure extends around its channel region providing access to the channel region on all sides. The nanosheet-based transistors are compatible with conventional metal-oxide-semiconductor (MOS) processes, allowing them to be aggressively scaled down while maintaining gate control and mitigating SCEs. Conventional nanosheet-based transistors, however, may include source/drain features that have dislocations extending from inner spacers. Such dislocations have been shown to degrade device characteristics. Therefore, although conventional nanosheet-based devices have been generally adequate for their intended purposes, they are not satisfactory in every respect. Accordingly, the present disclosure described structures of source/drain features that have reduced amounts of such dislocations, thereby providing methods for improved devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a three-dimensional (3D) perspective view of an embodiment of a nanosheet-based device of the present disclosure constructed according to some embodiments of the present disclosure.

FIG. 1B is a cross-sectional view of an embodiment of a nanosheet-based device of the present disclosure along the line A-A' in FIG. 1A constructed according to some embodiments of the present disclosure.

FIGS. 3, 4, 5, 6, 7, 8, 9, 10A, 10B, 11A, 11B, 12A, 12B, 12C, 13, 14, and 15 are cross-sectional views of embodiments of nanosheet-based devices of the present disclosure along the line A-A' in FIG. 1A, in portions or in entirety, constructed at various fabrication stages according to some embodiments of the present disclosure.

DETAILED DESCRIPTION

Figure 2A:
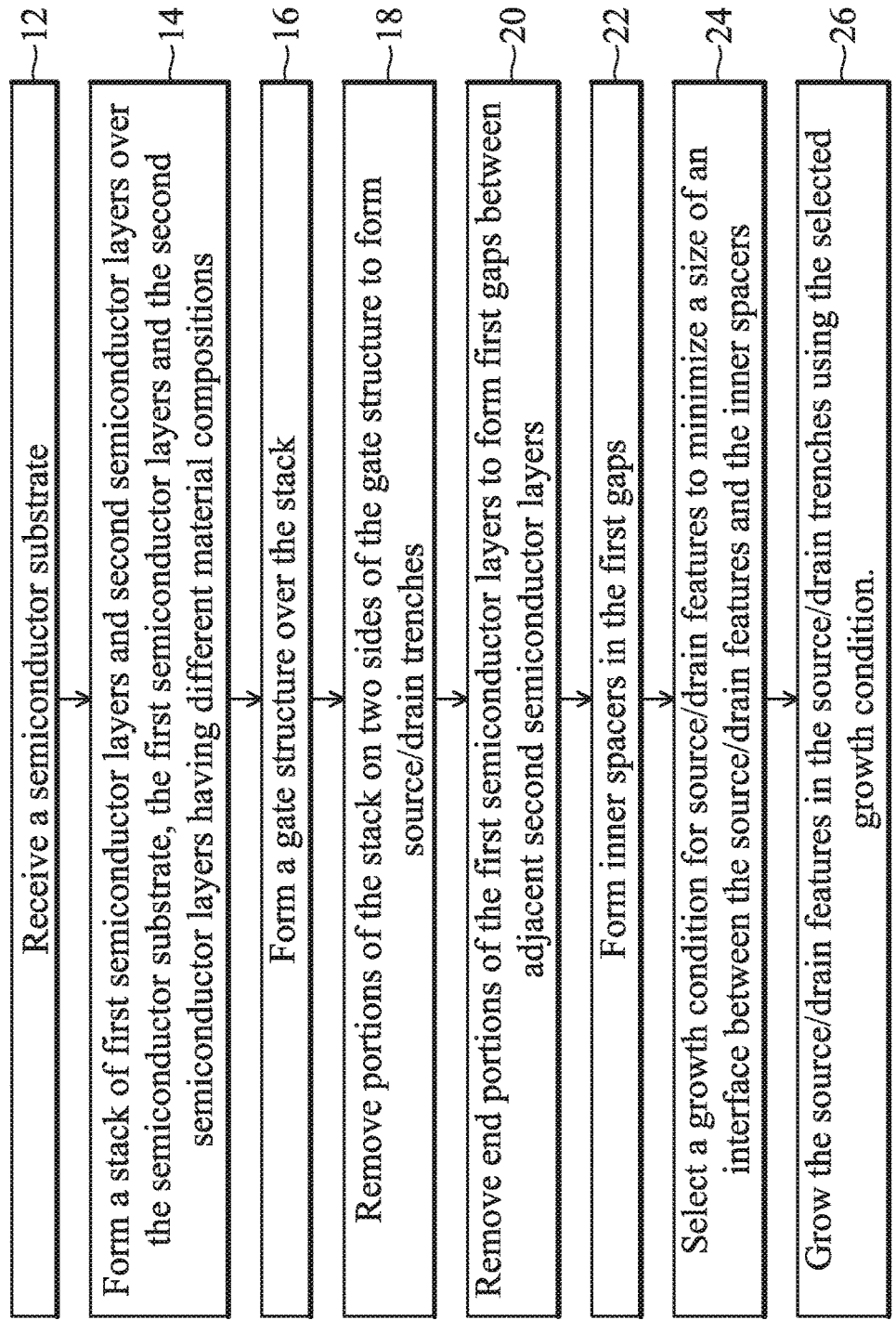
FIGS. 2A and 2B illustrate a flow chart of an example method for fabricating an embodiment of a nanosheet-based devices of the present disclosure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are broadly referred to as nanosheet-based transistors (or devices). A nanosheet-based device includes a plurality of suspended channel layers (or simply "channel layers") stacked one on top of another and engaged by a gate structure. The channel layers of a nanosheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nanosheet-based devices broadly encompasses devices having channel layers in nanowire, nano-bars, and any other suitable shapes. Further, the channel layers of the nanosheet-based devices may engage with a single, contiguous gate structure, or multiple gate structures.

The channel layers engage with a gate structure that includes portions between vertically adjacent channel layers. Meanwhile, channel layers connect a pair of epitaxial source/drain features (interchangeably referred to as epitaxial features or source/drain features), such that the charge carriers may flow from the source region to the drain region through the channel layers during the operation (such as when the transistors are turned on). Inner spacers are formed between the source/drain features and the respective gate structure such that proper electrical isolation is maintained. Generally, source/drain features grow from surfaces of the substrate and from surfaces of the channel layers. Overgrowth of the source/drain features eventually merge on sidewall surfaces of the inner spacers. In approaches not implementing the structures and/or methods described herein, the source/drain features may be configured to substantially cover the sidewall surfaces of the inner spacers. However, due to the difference in lattice structures, defects exist at the interfaces between the inner spacers and the source/drain features. These defects may propagate as dislocations within the source/drain features and lead to degraded crystal quality and reduced device performances. Accordingly, the present disclosure provides structures of improved source/drain feature designs that mitigate such issues.

The nanosheet-based devices presented herein may be an n-type metal-oxide-semiconductor (NMOS) device, a p-type metal-oxide-semiconductor (PMOS) device, or a complementary metal-oxide-semiconductor (CMOS) device. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from some aspects of the present disclosure.

An example nanosheet-based transistor 100 (or nanosheet-based device 100, or device 100) is illustrated in FIGS. 1A and 1B. FIG. 1A is a three-dimensional (3D) perspective view of an embodiment of device 100 that may be implemented as an NMOS device, a PMOS device, or part of a CMOS device, according to embodiments of the present disclosure. FIG. 1B is a cross-sectional view of the device 100 of FIG. 1A along the line A-A'. FIGS. 1A and 1B are provided for better visualization and understanding of features subsequently described in cross-sectional views. FIGS. 1A and 1B have been abbreviated and/or conceptualized, and may not include all features described in detail later. As illustrated, the device 100 includes a semiconductor substrate (or substrate) 102. Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane.

The fin structures 104 each have a source region 104a and a drain region 104a disposed along the X-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 may merge together, for example, along the Y-direction between adjacent fin structures 104 to provide a larger lateral width than an individual epitaxial source/drain feature. The fin structures 104 each further have a channel region 104b disposed between and connecting the source/drain regions 104a. The fin structures 104 each include a stack of suspended semiconductor layers 120 (also interchangeably referred to as "semiconductor layers 120," "suspended channel layers 120," "channel layers 120," "channels 120," or "higher channels 120") in the channel region 104b of the fin structures 104 and the stack extends vertically (e.g. along the Z-direction) from the substrate 102. Each of the suspended semiconductor layers 120 connects a pair of epitaxial source/drain features 500. The suspended semiconductor layers 120 may each be in one of many different shapes, such as wire (or nanowire), sheet (or nanosheet), bar (or nano-bar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. Inner spacer features 206 are formed between the gate structure 250 and the source/drain features 500 to provide protection and ensure proper isolation. Note that the gate structure 250 is illustrated as a transparent feature in FIG. 1A in order to illustrate the features (such as the semiconductor layers 120) that the gate structure 250 covers. FIGS. 1A and 1B have been abbreviated to provide a general picture of the device 100, and do not include all details. For example, FIGS. 1A and 1B do not show air gaps between the source/drain features 500 and the inner spacers 206. These details, along with additional details are described in conjunction with subsequent figures.

The device 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 1A, the fin structure 104 is located above the top surface of the isolation features 150. In the depicted embodiment, the device 100 further includes gate spacer layers 202 on both sides of the gate structures 250; contact etch stop layers 220 over the epitaxial source/drain features 500; and interlayer dielectric (ILD) layer 350 over the epitaxial source/drain features 500 and over the contact etch stop layers 220.

Figure 2B:
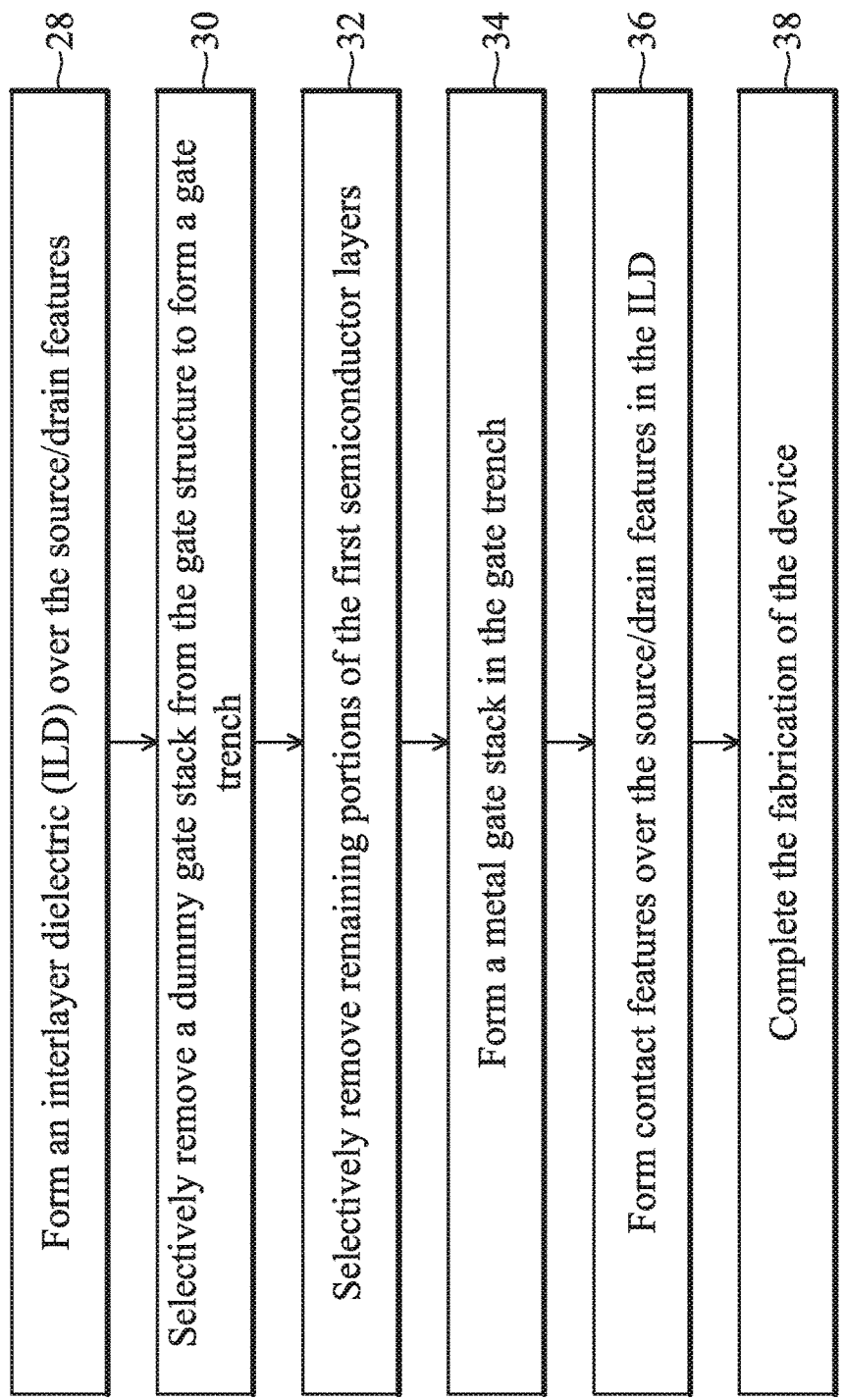

FIGS. 2A and 2B are flow charts illustrating an example method 10 for fabricating a device 100 of the present disclosure according to some embodiments of the present disclosure. FIGS. 3-10, 11A, 11B, 12A-12C, 13, 14, and 15 are cross-sectional views of the device along the line A-A' in FIG. 1A, or expanded views thereof, constructed at various fabrication stages according to embodiments of the method 10.

Figure 3:
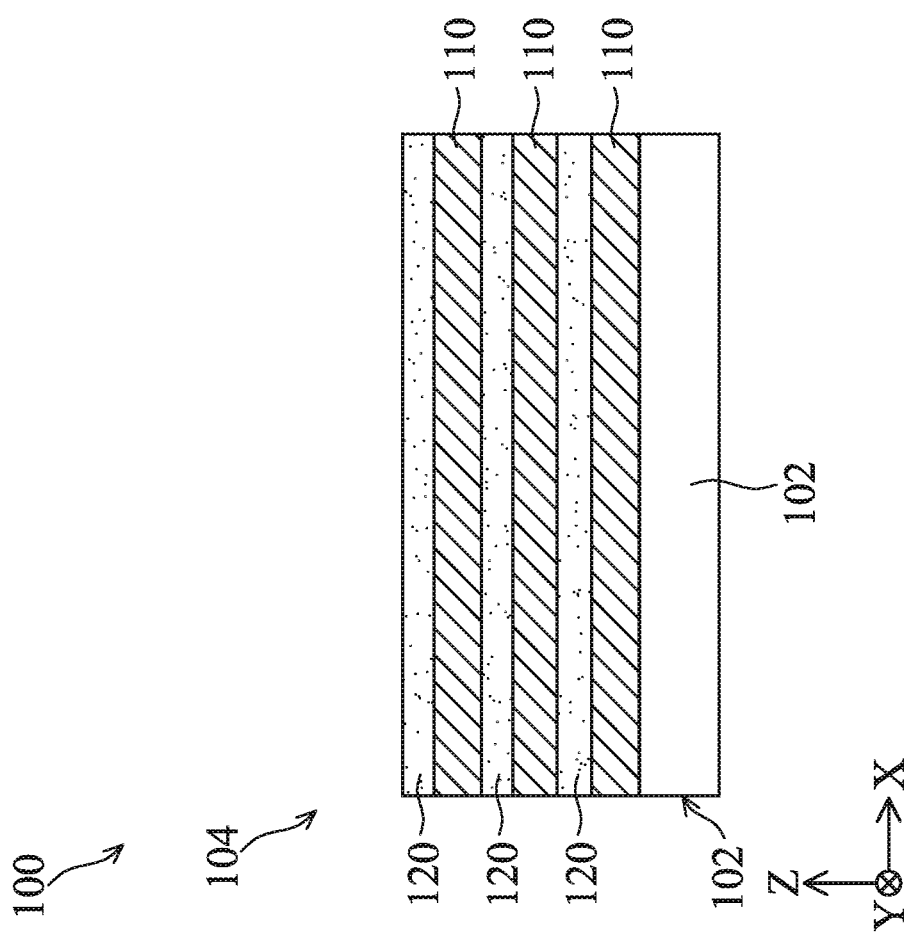

Referring to block 12 of FIG. 2A and FIG. 3, the device 100 includes a substrate 102. The substrate 102 contains a semiconductor material, such as bulk silicon (Si), germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Descriptions below illustrate the fabrication of an NMOS device 100 as an example. The same or similar methods may be implemented for PMOS devices or CMOS devices.

Referring to block 14 of FIG. 2A and FIG. 3, a stack of semiconductor layers is formed over the substrate 102. The stack of semiconductor layers includes semiconductor layers 110 and semiconductor layers 120 alternating with each other. For example, a semiconductor layer 110 is formed over the substrate 102; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. For example, in the depicted embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In yet some other embodiments, the semiconductor layers 120 and 110 both contain SiGe, but have different Ge atomic concentrations. The semiconductor layers 110 may each have a same or different thickness from each other, and from thickness(es) of the semiconductor layers 120.

The stacks of semiconductor layers are patterned into a plurality of fin structures 104 such that they each extend along the X-direction. The fin structures 104 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths along the Y-direction that are the same between each other or different from each other.

Figure 4:
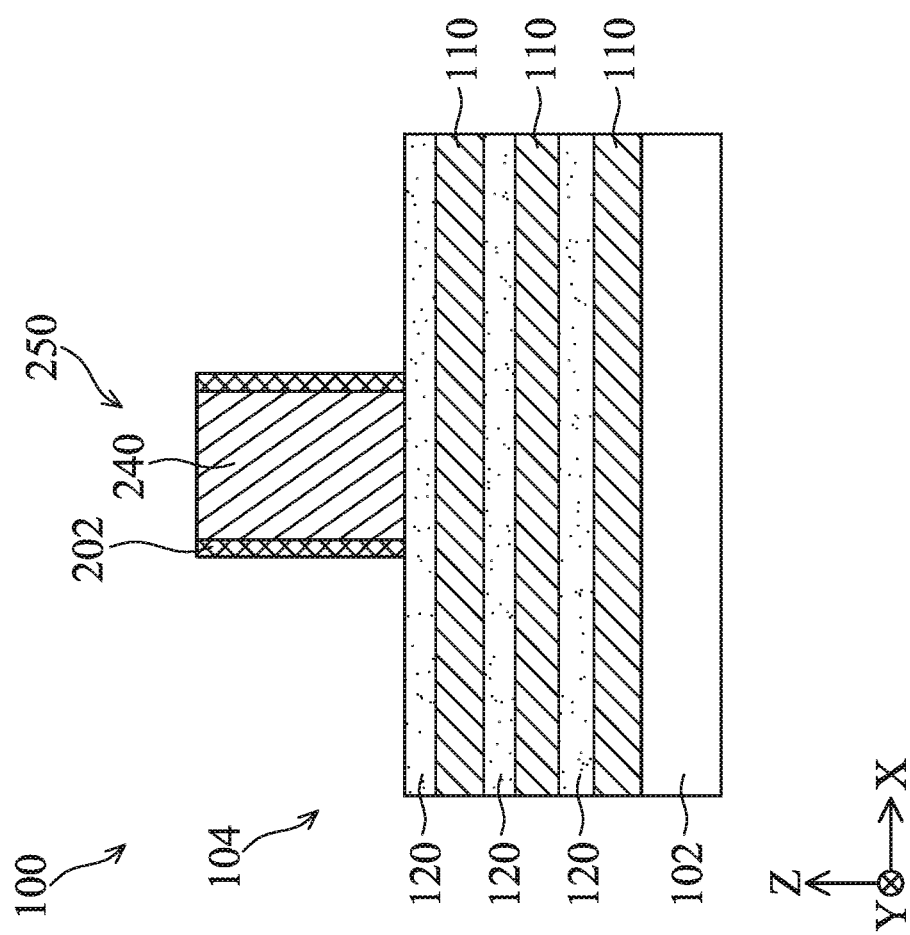

Referring to block 16 of FIG. 2A and FIG. 4, gate structures 250 are formed over a portion of each of the fin structures 104. In some embodiments, the gate structures 250 are also formed over the isolation features 150 in between adjacent fin structures 104. The gate structures 250 may be configured to extend lengthwise parallel to each other, for example, each along the Y-direction. In some embodiments, the gate structures 250 each wrap around the top surface and side surfaces of each of the fin structures 104. The gate structures 250 may include a dummy gate stack 240. The dummy gate stack 240 includes a dummy gate dielectric layer, a dummy electrode layer, as well as one or more hard mask layers used to pattern the dummy gate electrode layer. In some embodiments, the dummy electrode layer includes polysilicon. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, or combinations thereof.

Gate spacers 202 are formed on the sidewalls of the dummy gate stacks 240. In the depicted embodiment, a gate spacer layer 202 is formed over the top surface of the device. The gate spacer layers 202 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacers 202 may include multiple sub-layers each having a different material. In some embodiments, the gate spacer layers 202 may have a thickness in the range of a few nanometers (nm). In some embodiments, the gate spacer layers 202 may be formed by depositing a spacer layer (containing the dielectric material) over the dummy gate stacks 240, followed by an anisotropic etching process to remove portions of the spacer layer from the top surfaces of the dummy gate stacks 240. After the etching process, portions of the spacer layer on the sidewall surfaces of the dummy gate stacks 240 substantially remain and become the gate spacer layers 202. In some embodiments, the anisotropic etching process is a dry (e.g. plasma) etching process. Additionally or alternatively, the formation of the gate spacer layers 202 may also involve chemical oxidation, thermal oxidation, ALD, CVD, and/or other suitable methods.

Figure 5:
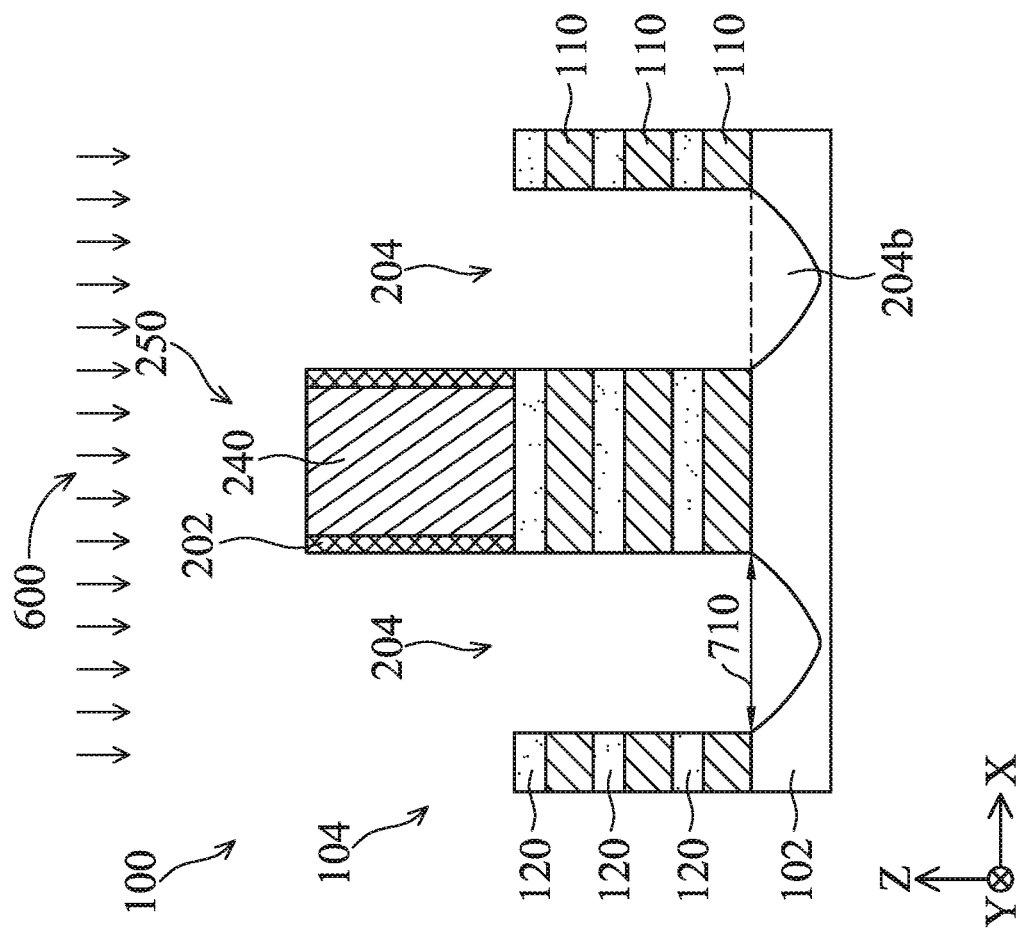

Referring to block 18 of FIG. 2A and FIG. 5, portions of the fin structure 104 adjacent to and exposed by the gate structures 250 (e.g. in the source/drain regions 104a, see FIGS. 1A and 1B) are at least partially recessed (or etched away) by process 600 to form the source/drain trenches 204. Meanwhile, the portions of the fin structure 104 underneath the gate structures 250 remain intact. Additional mask elements (such as photoresists) may also be employed to protect areas not designed to be removed during the process 600. In the depicted embodiment, the process 600 removes not only the exposed portions of fin structure 104, but also a portion of the underlying substrate 102. Accordingly, the source/drain trenches 204 extends below the top surface of the substrate 102. The bottom portion of the source/drain trenches 204 below the top surface of the substrate 102 are hereinafter referred to as trench portions 204b. The trench portions 204b are also below the lowest layer of subsequently formed channel layers. Accordingly, the trench portions 204b may be referred to as the "sub-channel" portion of the source/drain trench 204. The process 600 may include multiple lithography and etching steps, and may use any suitable methods, such as dry etching and/or wet etching. In some embodiments, the trenches 204b has a profile that resembles the "V" letter although the two prongs of the "V" may be curved, and the bottom of the "V" may be rounded. However, the present disclosure contemplates trench portions 204b that have any suitable profiles. In some embodiments, the top surface of the trench portions 204b may have a width 710 along the X-direction. This dimension determines a lateral dimension of the subsequently formed source/drain features. In some embodiments, the width 710 may be about 10 nm to about 30 nm. If the width 710 is too small, such as less than about 10 nm, the source/drain features formed therein may not provide sufficient charge carriers to function as designed. If the width 710 is too large, such as greater than about 30 nm, any benefit may be offset by the increase in the chip footprint and the loss of efficiency due to that.

The formation of the source/drain trenches 204 exposes sidewalls of the stack of semiconductor layers 110 and 120. Referring to block 20 of FIG. 2A and FIG. 6, portions of the semiconductor layers 110 are removed through the exposed sidewall surfaces in the source/drain trenches 204 via a selective etching process, such as process 620. Because process 620 recesses the semiconductor layers 110 in a lateral direction along the X-direction, process 620 may sometimes be referred to as a lateral etching process, or a lateral recessing process. The process 620 is designed to remove end portions of the semiconductor layers 110 but only minimally affect the semiconductor layers 120. For example, two end portions of the semiconductor layers 110 may be removed to form respective openings 205, while the end portions of the semiconductor layers 120 directly above and below the removed end portions of the semiconductor layers 110 (hence above and below the openings 205) are substantially preserved. Therefore, openings 205 are formed between the vertically adjacent semiconductor layers 120.

Figure 6:
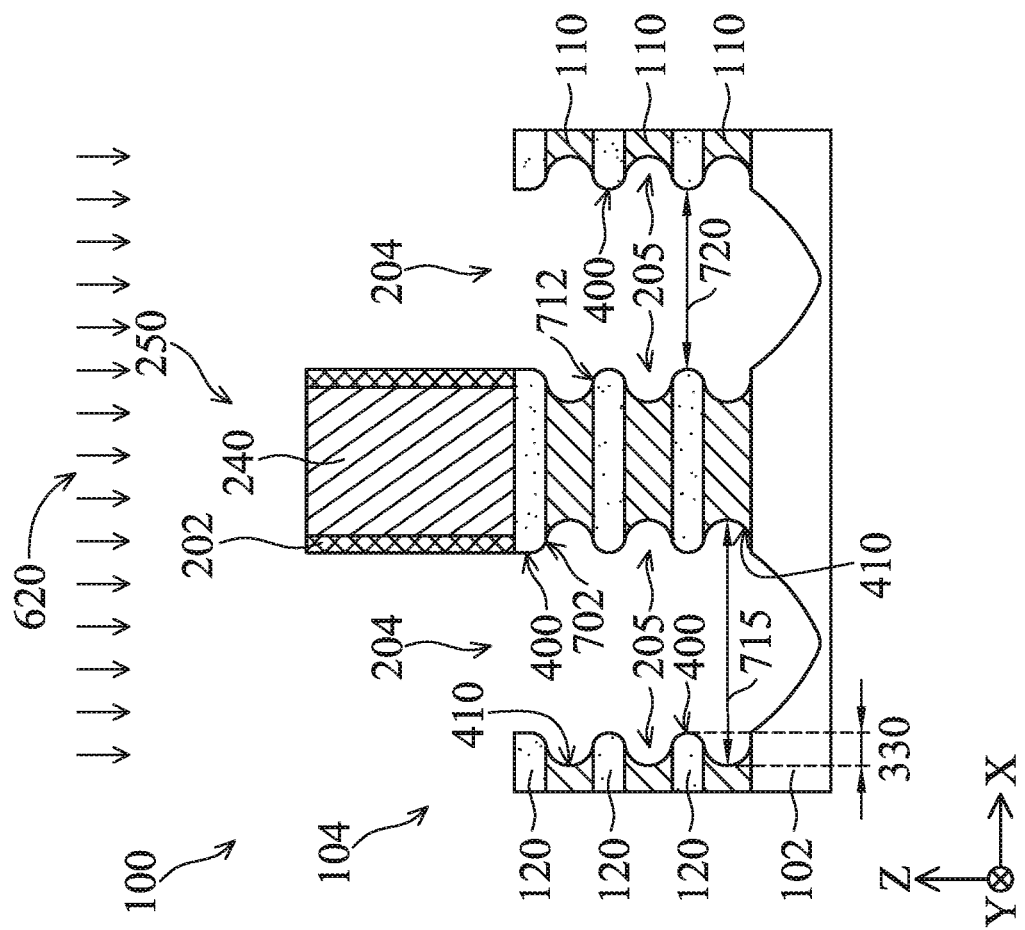

The openings 205 formed during the process 620 extend the source/drain trenches 204 into areas beneath and between the semiconductor layers 120 and under the gate spacer layers 202. The extent to which the semiconductor layers 110 are laterally recessed (or the size of the portion removed) is determined by the processing conditions such as the duration that the semiconductor layers 110 is exposed to an etching chemical. In the depicted embodiments, the duration is controlled such that the opening 205 has a depth 330 along the X-direction. The depth 330 determines the upper limit of the lateral widths of inner spacers to be formed within the openings 205. In some embodiments, the etching process conditions cause the openings 205 to have curved surfaces. For example, as illustrated in FIG. 6, the remaining portions of the semiconductor layers 110 may have a concave surface 410 facing the openings 205. Accordingly, the openings 205 may have a larger width (along the X-direction) at its mid-height (along the Z-direction) than at its top or bottom interfaces with the semiconductor layers 120 or with the substrate 102. In some embodiments, however, the remaining portions of the semiconductor layers 110 may instead have approximately straight (or flat surfaces).

The process 620 may be any suitable processes. In the depicted embodiments, the semiconductor layers 120 include Si and the semiconductor layers 110 include SiGe. The process 620 may be a wet etching process, such as a Standard Clean 1 (SC-1) solution. The SC-1 solution includes ammonia hydroxide (NH$_4$OH), hydrogen peroxide (H$_2$O$_2$), and water (H$_2$O). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters.

Additionally, the sidewalls of the semiconductor layers 120 may also have curved surfaces after process 620 completes. As described above, although the semiconductor layers 120 are largely preserved during the process 620 due to their etching resistance to the etching chemical, they nevertheless may have their profiles slightly modified, particularly in their end portions above and below the openings 205. For example, prior to the process 620, these end portions may have substantially straight sidewall surfaces (see FIG. 5). After the process 620, the sidewall surfaces become more rounded and with a convex profile facing the source/drain trenches 204. The sidewall surface after the process 620 is referred to as surface 400. In other words, the semiconductor layers 120 may have a larger length along the X-direction at its mid-height (along the Z-direction) than at its top or bottom interfaces with the semiconductor layers 110 (and the openings 205). In some embodiments, opposing surfaces 400 of adjacent semiconductor layers 110 are separated by a distance (or separation) 720. In some embodiments, the separation 720 is about 10 nm to about 30 nm, similar to the separation 710 of FIG. 5. In some embodiments, however, the surfaces 400 may instead be straight (or flat). In still some embodiments, the surface 400 may instead be convex facing away from the source/drain trenches 204.

Figure 7:
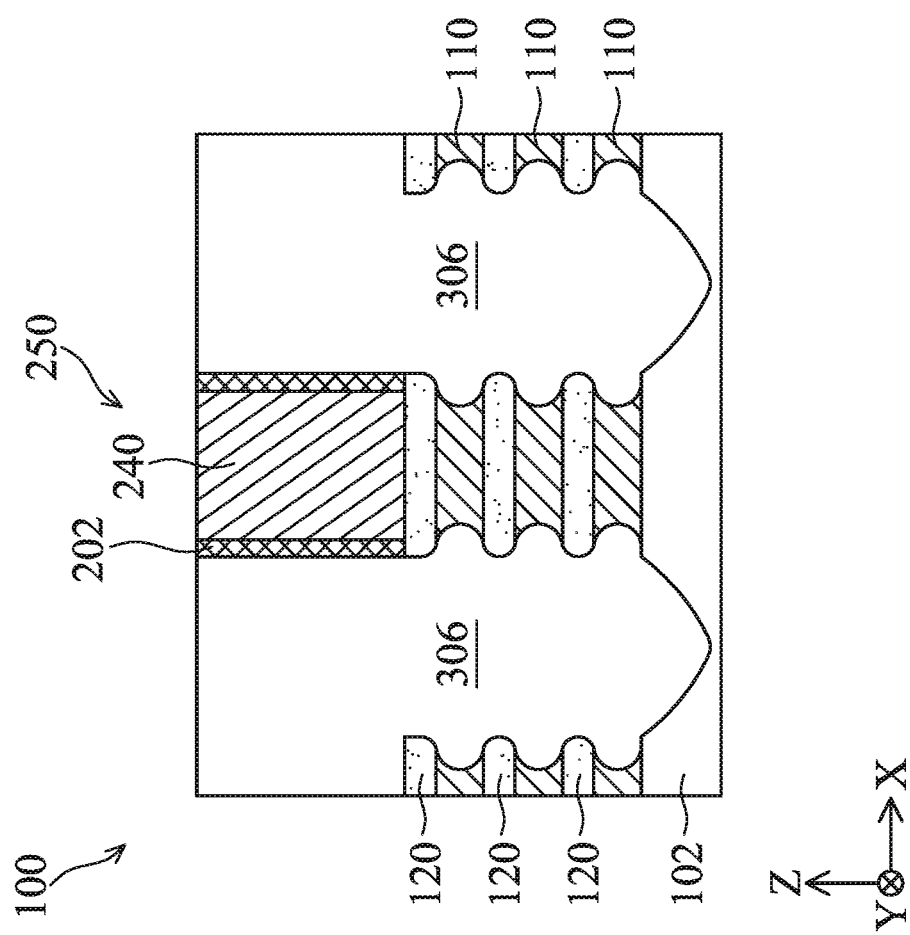

Referring to block 22 of FIG. 2A and FIG. 7, a dielectric material 306 is deposited into both the source/drain trenches 204 and the openings 205. In an embodiment, the dielectric material 306 may be selected from SiO$_2$, SiON, SiOC, SiOCN, or combinations thereof. In some embodiments, the proper selection of the dielectric material may be based on its dielectric constant. The deposition of the dielectric material 306 may be any suitable methods, such as CVD, PVD, PECVD, MOCVD, ALD, PEALD, or combinations thereof. In the depicted embodiment, the dielectric material 306 may have a top surface that extends along a top surface of the gate structure 250. For example, the dielectric material 306 may be deposited to a height over the top surface of the gate structure 250, and a CMP process may be performed to planarize the top surfaces of the device, and to expose the top surfaces of the gate structure 250.

Figure 8:
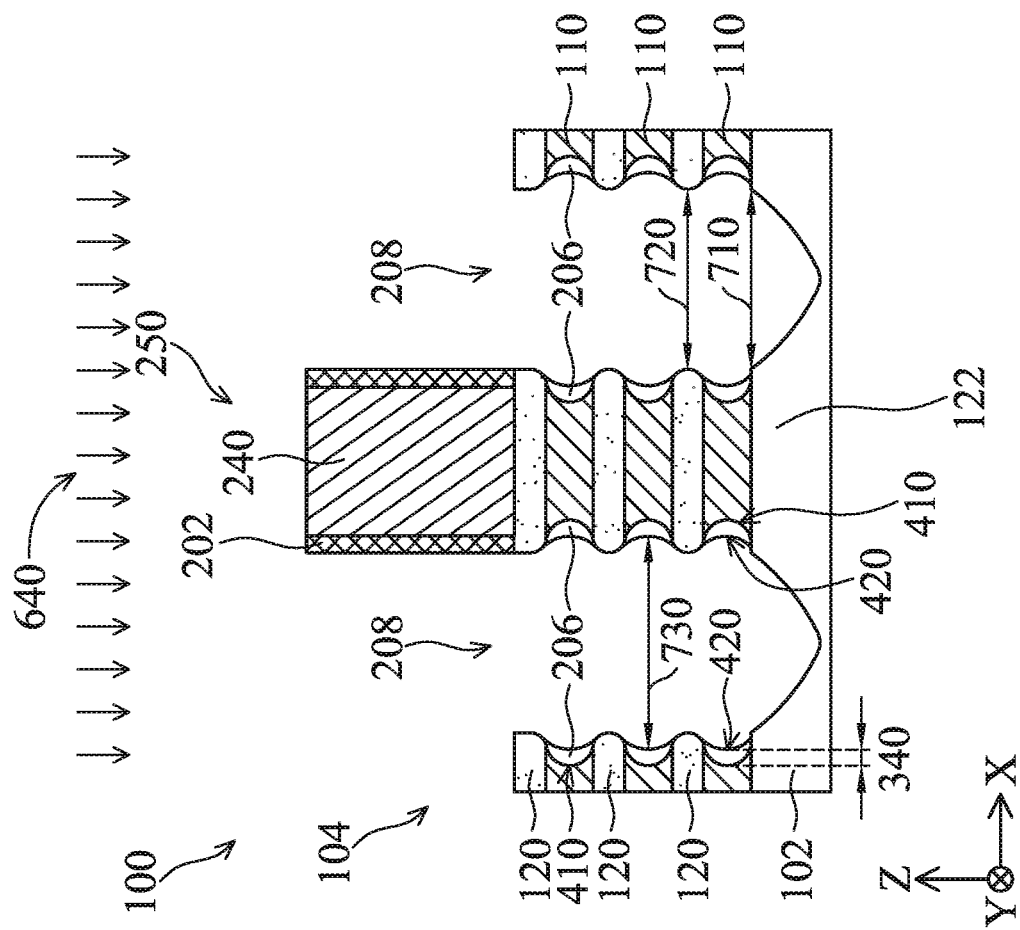

Referring to FIG. 8, the dielectric material 306 is partially etched back by process 640 to form new source/drain trenches 208. The partial etching-back completely removes the dielectric materials 306 within the original source/drain trenches 204, and in the depicted embodiments, further removes a portion, but not all, of the dielectric materials 306 within the original openings 205 (compare FIG. 6). The dielectric materials 306 remaining in the openings 205 become the inner spacers 206. Accordingly, the inner spacers 206 are formed between vertically adjacent end portions of the semiconductor layers 120. Alternatively, a masking element may be used. The inner spacers 206 interface with the remaining portions of the semiconductor layers 110 at the surface 410. Additionally, the inner spacers 206 have a new surface 420 exposed in the source/drain trenches 208. The distance between the surfaces 410 and 420 defines the lateral width 340 of the inner spacers 206. The new surface 420 may be of a same or different profile as that of the surface 410. When the surfaces 410 and 420 have different profiles, the inner spacers 206 may have varying lateral widths at different heights of the inner spacers 206 along the Z-direction. In such embodiments, the lateral width 340 represents the maximum lateral width of the inner spacers 206, such as the lateral width along the X-direction at the respective half-height along the Z-direction. In some embodiments, the separation between sidewall surfaces of opposing inner spacers 206 is the distance 730. In the depicted embodiments, the separations 730 at different height levels (such as the height level aligned with the mid-height line of the lowest, middle, or highest semiconductor layer 110) are substantially the same. In some embodiments, the separation 730 may be about 10 nm to about 30 nm. In some approaches, the separation 730 between two opposing surfaces 420 of adjacent inner spacers 206 defines a lateral dimension of an epitaxial layer subsequently formed in the source/drain trenches 208. By contrast, as described below, the present disclosure provides that the separation 730 is greater than the lateral dimension of the epitaxial layer formed therein at the respective height.

The method 10 proceeds to form source/drain features 500 in the source/drain trenches 208. Generally, the source/drain features 500 may be formed by an epitaxial process. For example, the depicted embodiments may implement epitaxial process 660. The epitaxial process may include performing an epitaxial deposition/partial etch process and repeating the epitaxial deposition/partial etch process. Accordingly, the epitaxial process is a cyclic deposition/etch (CDE) process. Details of the CDE process has been described in U.S. Pat. No. 8,900,958 titled "Epitaxial formation mechanisms of source and drain regions" by Tsai and Liu, which is herein incorporated in its entirety for reference. Briefly, the deposition operation of the epitaxial process may implement gaseous or liquid precursors. The precursors may interact with the semiconductor materials of the substrate 102, thereby forming a semiconductor epitaxy. In some embodiments, the deposition operation may use chemical vapor deposition (CVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. Then, an etching operation (such as a dry etching operation utilizing a halogen-based etching chemical) is conducted to remove amorphous semiconductor materials from the surface of the semiconductor epitaxy. In some embodiments, the etching operation also removes portions of the semiconductor epitaxy that include dislocations or other defects. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer (as a part of the source/drain features 500) is reached. In some embodiments, the epitaxial process may instead be a selective epitaxial growth (SEG) process. The selective epitaxial growth process utilizes simultaneous deposition and etch operations. In some embodiments, the epitaxial process may include both CDE operations and SEG operations.

Figure 9:
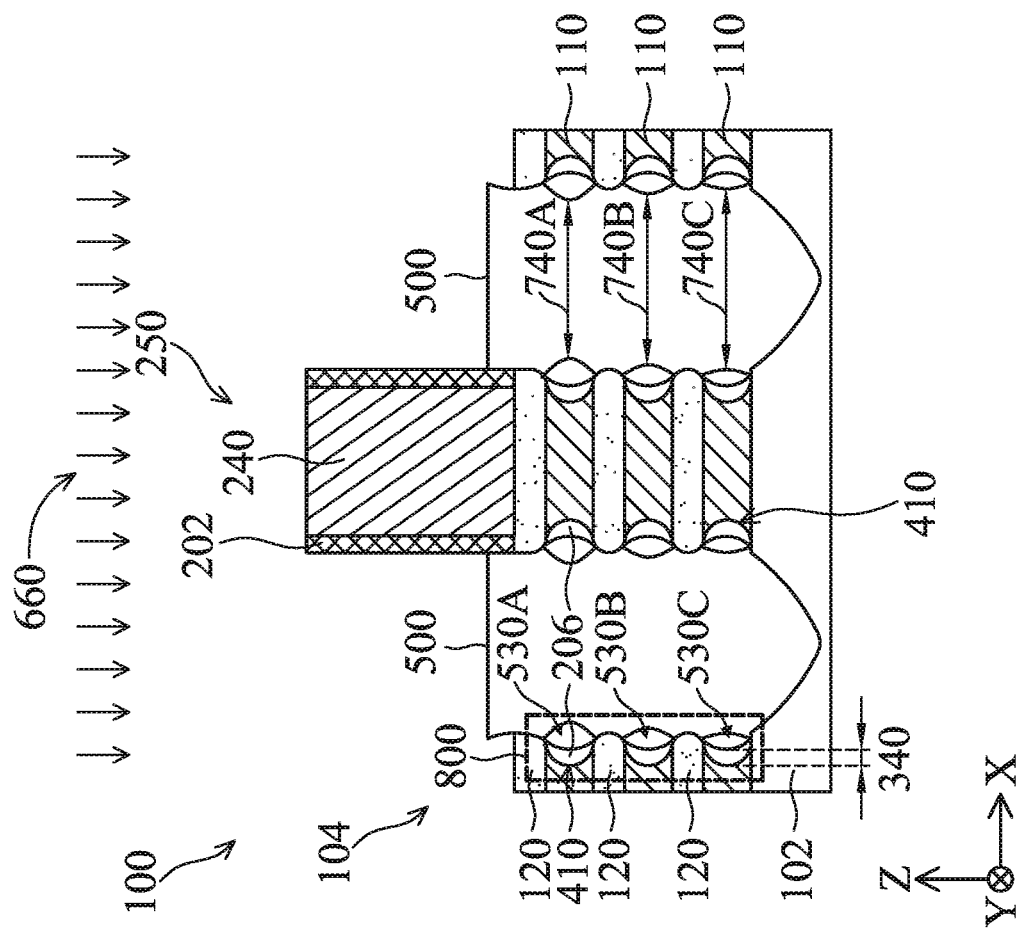

Typically, the growth of the semiconductor epitaxy initiates from surfaces of the semiconductor materials and does not initiate from dielectric materials. Therefore, at the beginning of the epitaxial process 660, the sidewall surfaces 400 of the semiconductor layers 120 (see FIG. 6), as well as the top surfaces of the substrate 102, are exposed in the source/drain trenches 208. Accordingly, the growth of the source/drain features initiates vertically from the top surfaces of the substrate 102, and laterally from the surfaces 400 of the semiconductor layers 120. No growth occurs from the dielectric material of the inner spacers 206. Accordingly, as the source/drain features 500 grow in sizes, growth fronts of the epitaxy process from adjacent surfaces eventually merge with each other to form a contiguous source/drain feature. In some approaches not implementing the methods described herein, such merging may occur on sidewall surfaces of the inner spacers 206, such that the source/drain features 500 share interfaces with the inner spacers 206. In other words, any initial air gaps that may have formed during the epitaxial process 600 are eliminated at the end of the process. However, it has been discovered that the presence of such interfaces between dissimilar materials (e.g. the semiconductor material of the source/drain features 500 and the dielectric material of the inner spacer 206) may result in defects at such interfaces. These defects propagate in subsequent crystal growth of the source/drain features 500 as dislocations and lead to degraded crystal quality and reduced device performances. By contrast, as illustrated in FIG. 9, and in more detail in FIGS. 10A, 10B, 11A, and 11B, the present disclosure provides forming and maintaining air gaps 530A-530C between the source/drain features 500 and the inner spacers 206 to avoid or reduce the formation of the dislocations.

As described above, and referring to block 24 of FIG. 2A, the growth condition for the source/drain features 500 are selected to form the epitaxial source/drain features 500 to partially fill the source/drain trenches 208, while leaving air gaps (or voids) 530A-530C between the source/drain features 500 and the inner spacers 206. In some embodiments, the selection of the growth condition includes selecting proper parameters of the deposition operations and the etching operations. In some embodiments, the process 660 includes an SEG portion. For example, the deposition operation and the etching operation are conducted simultaneously with both the precursor and the etchant injected into the reactor at the same time. In some embodiments, the deposition operation may implement a precursor of dichlorosilane (DCS), introduced at a temperature of about 600° C. to about 750° C. at a flow rate $r_d$ of about 600 sccm to about 1200 sccm. In some embodiments, the etch operation may implement hydrogen chloride as an etchant. The etchant may be introduced at a flow rate $r_e$ of about 200 sccm to about 40,000 sccm. In some embodiments, a ratio of $r_e:r_d$ is about 0.2:1 to about 50:1. In some embodiments, the process 600 includes adjusting the flow rate $r_e$ of the etchant (and consequently the ratio of $r_e:r_d$) to avoid or minimize the formation of the epitaxial material on sidewall surfaces of the inner spacers 206, while maintaining a suitable growth rate of the epitaxial material on sidewall surfaces of the semiconductor layers 120. In some embodiments, the ratio of $r_e:r_d$ is selected to be about 1:1 to about 20:1. In some embodiments, the ratio of $r_e:r_d$ is about 2:1 to about 10:1. If the deposition flow rate is too large, if the etch flow rate is too small, or if the ratio $r_e:r_d$ is too small, air gaps 530A-530C may not be successfully formed, and benefits associated therewith, as described below, will be lost; if the deposition flow rate is too small, if the etch flow rate is too large, or if the ratio $r_e:r_d$ is too large, source/drain features growth may be too slow to meet processing demands.

Figure 10B:
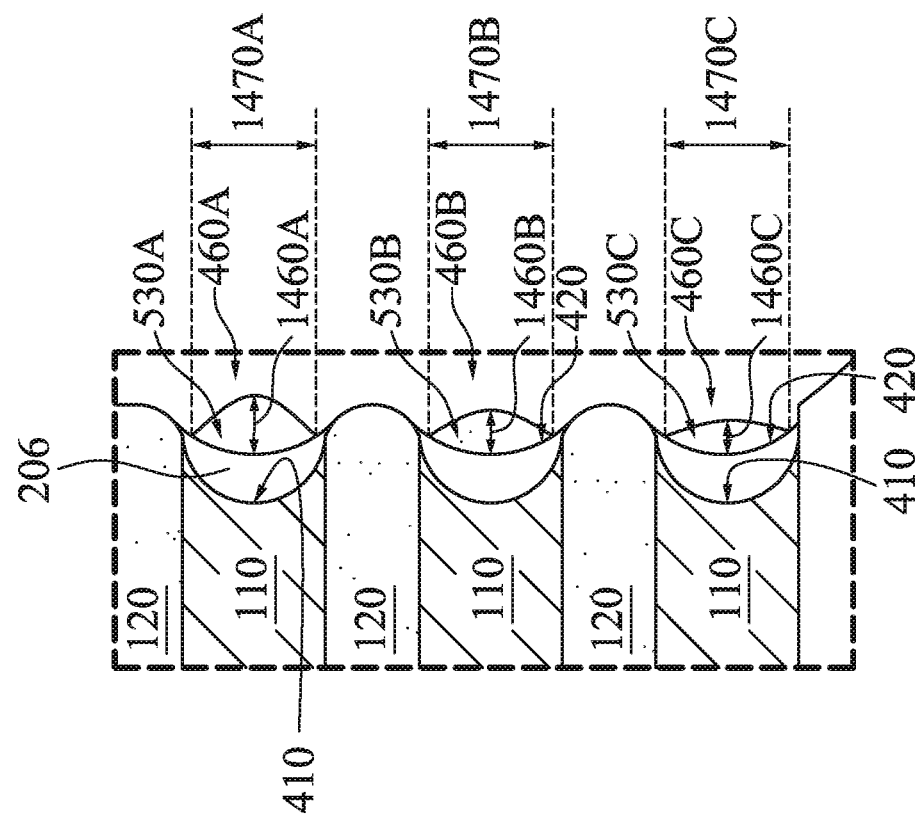
Figure 10A:
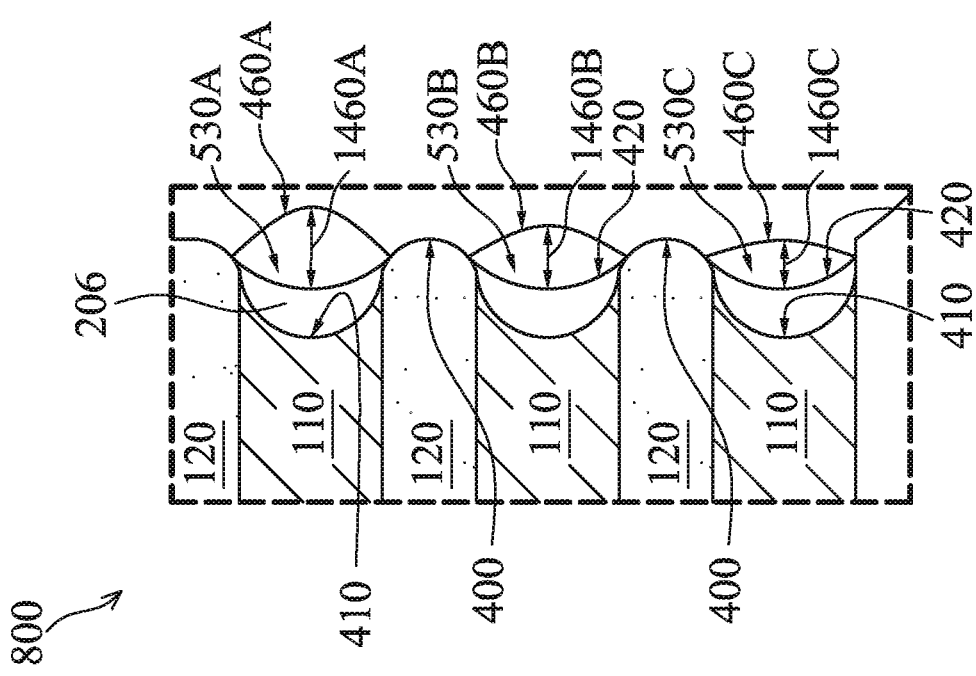
Figures 11A, 11B:
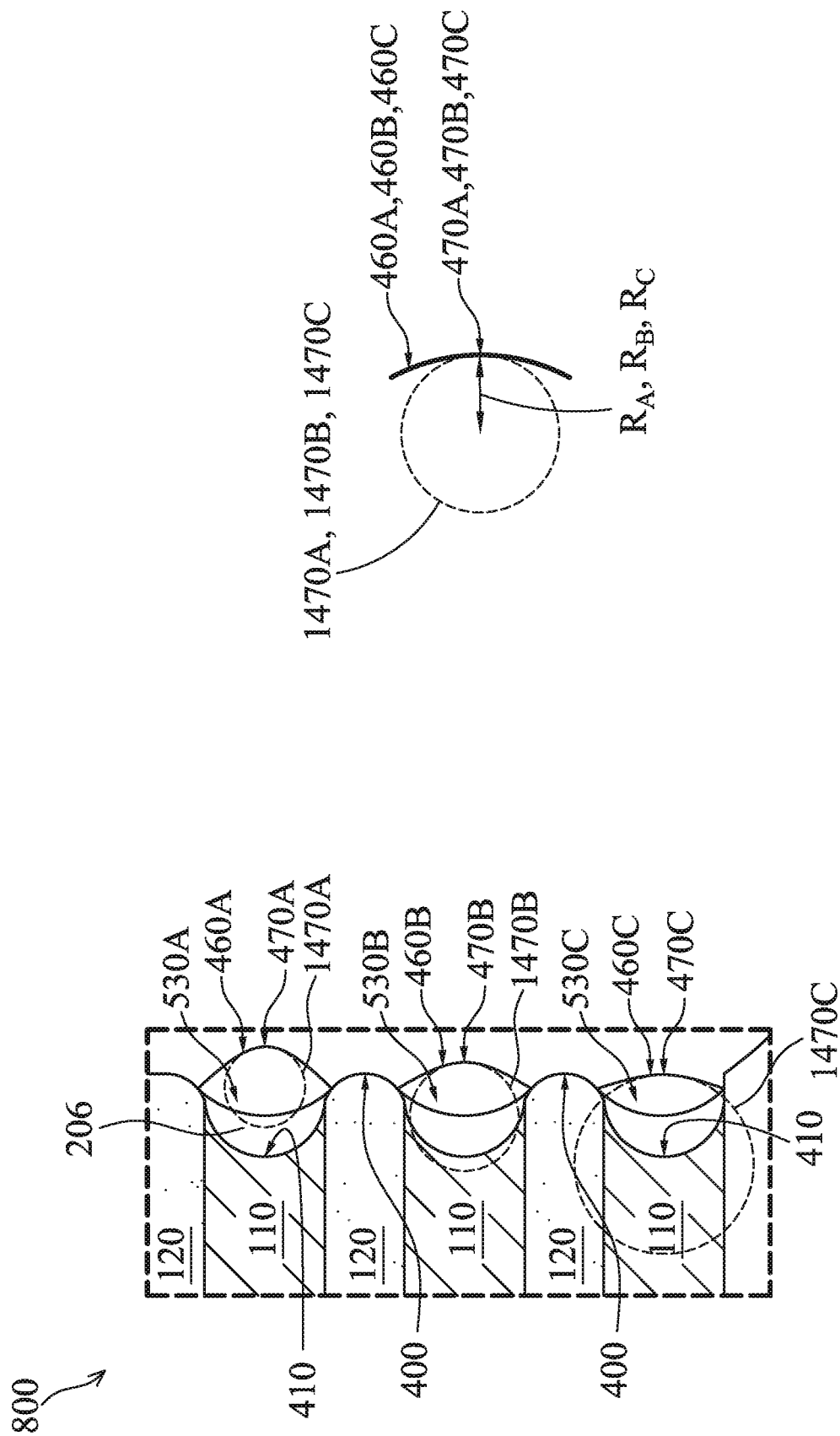

Subsequently, referring to block 26 of FIGS. 2A and 9, epitaxial source/drain features 500 are formed in the source/drain trenches 208 using the selected growth conditions. FIGS. 10A, 10B, and 11A illustrate portion 800 of the device 100 in expanded views to further describe the air gaps 530A-530C. Referring FIG. 10A, air gaps 530A are formed between the source/drain features 500 and the topmost inner spacers 206; air gaps 530B are formed between the source/drain features 500 and the middle inner spacers 206; and air gaps 530C are formed between the source/drain features 500 and the bottommost inner spacers 206. As described above, fewer or more semiconductor layers 120 may be present in the device 100. Accordingly, fewer or more inner spacers 206, and consequently few or more air gaps may be present in the device 100. As illustrated in FIG. 10A, the source/drain features 500 may have sidewall surface segments (or simply "sidewall surfaces") 460A-460C facing the respective inner spacers 206. In the depicted embodiments, the sidewall surfaces are concavely facing the inner spacers 206. However, in some embodiments, the sidewall surfaces 460A-460C may instead be convexly facing the inner spacers 206 or be flat (or straight).

The sidewall surfaces 460A-460C of the source/drain feature 500, collectively with the sidewall surfaces 420 of the inner spacers 206, define the air gaps 530A-530C, respectively. The air gap 530A may have a lateral dimension 1460A along the X-direction at the mid-height level of the highest semiconductor layer 110; the air gap 530B may have a lateral dimension 1460B at the mid-height level of the middle semiconductor layer 110; the air gap 530C may have a lateral dimension 1460C at the mid-height level of the lowest semiconductor layer 110. In the depicted embodiments, the lateral dimensions 1460A-1460C coincides with the maximum distances between the sidewall surfaces 420 of the inner spacers 206 and the respective sidewall surfaces 460A-460C of the source/drain feature 500. However, depending on the profiles of the surfaces 420 and the surfaces 460A-460C, the lateral dimensions 1460A-1460C may be less than the maximum dimensions of the air gaps 530A-530C. As illustrated in FIG. 10A, in the depicted embodiments, the lateral size (e.g. along the X-direction) of the air gaps 530A-530C may be different from one another. For example, the lateral dimension 1460A may be greater than the lateral dimensions 1460B and 1460C; and the lateral dimension 1460B may be greater than the lateral dimension 1460C. In such embodiments, having air gaps with smaller sizes in the lower regions of the device results in larger source/drain feature volumes at the respective height and generally results in greater amount of available charge carriers adjacent the lower channels. This may balance out weakened gate control in the lower channels and improves performances. In some embodiments, the lateral dimension 1460C may be greater than the lateral dimensions 1460B and 1460A. The greater lateral dimension 1460C may reduce the mesa leakage between the source/drain features and the substrate thereby improving device characteristics. In some embodiments, the lateral dimensions 1460A, 1460B, and 1460C may each be about 0.1 nm to about 15 nm. In some embodiments, the lateral dimensions 1460A, 1460B, and 1460C may each be about 1 nm to about 5 nm. If the lateral dimensions are too large, damages to source/drain features may occur in a subsequent channel release process; if the lateral dimensions are too small, some merging may still occur on the sidewall surfaces of the inner spacers 206, such that dislocations are not maximally removed.

In some embodiments, as illustrated in FIG. 10A, the air gaps 530A-530C each have vertical dimensions corresponding to the thicknesses of the semiconductor layers 110. In other words, the air gaps 530A-530C may extend from a bottom surface of a semiconductor layer 120 to a vertically adjacent semiconductor layer 120, and the vertical dimensions of the air gaps 530A-530C are substantially equal to the separation of the vertically adjacent semiconductor layers 120. Alternatively, referring to FIG. 10B, the air gaps 530A-530C each have a respective vertical dimension 1470A-1470C that is less than the thicknesses of the semiconductor layers 110. In some embodiments, the dimensions 1470A-1470C is each greater than half of the vertical thickness for the semiconductor layer 110. In other words, at least half of the sidewall surfaces of the inner spacers are exposed in the air gaps 530A-530C. In some embodiments, the dimensions 1470A-1470C may be greater than about 60% to about 100% of the vertical thickness of the semiconductor layer 110. In some embodiments, if the dimensions 1470A-1470C are too small, such as less than about 50% of the thickness of the semiconductor layer 110, there may be still substantial amount of interface between the dissimilar materials (inner spacers 206 and the source/drain features 500), and defects may lead to dislocations. If the dimensions 1470A-1470C are too large, such as greater than the vertical thickness of the semiconductor layer 110, the air gap may interpose between a portion of the channel layers and the source/drain features, thereby narrowing the conductive pathway and lead to increased thickness.

Referring to FIGS. 11A-11B, sidewall surfaces 460A-460C may each include an apex 470A-470C at the mid-height of the respective air gap (and corresponding to the mid-height of the semiconductor layers 110). In some embodiments, osculating circles that best approximate the respective sidewall surfaces 460A-460C at the respective apex 470A-470C may have a respective radius $R_A$-$R_C$, which defines the curvature $K_A$-$K_C$ of the sidewall surfaces 460A-460C as the inverse of the respective radius $R_A$-$R_C$. In some embodiments, the radius $R_A$ is less than the radius $R_B$ and $R_C$, and the radius $R_B$ is less than the radius $R_C$. Accordingly, the curvature $K_A$ is greater than the curvature $K_B$ and curvature $K_C$; and the curvature $K_B$ is greater than the curvature $K_C$.

Referring back to FIG. 9, in some embodiments, because of the presence of the air gaps 530A, 530B, and 530C, the source/drain features 500 may have lateral dimensions along the X-direction that are less than the corresponding dimensions (for example the separation 730) of the source/drain trenches 208 at the respective height. For example, the lateral dimension of the source/drain features 500 at the height level corresponding to the mid-height level of the highest semiconductor layer 110 is the dimension 740A; the lateral dimension of the source/drain features 500 at the height level corresponding to the mid-height level of the middle semiconductor layer 110 is the dimension 740B; and the lateral dimension of the source/drain features 500 at the height level corresponding to the mid-height level of the lowest semiconductor layer 110 is the dimension 740C. As compared to the separation 730 (FIG. 8), the dimensions 740A, 740B, and 740C are smaller. The differences are attributed to the size of the air gaps 530A, 530B, and 530C, respectively. In some embodiments, the dimensions 740A, 740B, and 740C may each be about 8 nm to about 28 nm. If the dimensions 740A, 740B, and 740C are too small, such as less than about 8 nm, the air gaps may be too large such that source/drain features may be compromised during the channel release process; while if the dimensions 740A, 740B, and 740C are too large, such as greater than about 28 nm, the air gaps may be too small to maximally remove dislocations. In some embodiments, the dimension 740A may be less than the dimensions 740B and 740C, and the dimension 740B may be less than the dimension 740C.

Although not explicitly depicted, the epitaxial source/drain features 500 may include one or more than one layers. In some embodiments, different layers of the epitaxial source/drain features 500 may have different semiconductor materials and/or different dopant compositions. In some embodiments, the device 100 is configured as an n-type device. Accordingly, the source/drain features 500 include n-type semiconductor materials, such as silicon. Furthermore, the source/drain features 500 (or a portion thereof) includes a dopant element. The doping improves the mobility of charge carriers that migrate from one source/drain features 500 through the semiconductor layers 120 to another source/drain features 500 during operation. For example, the dopant may include Arsenic (As), phosphorous (P), antimony (Sb), bismuth (Bi), or combinations thereof. In some embodiments, the device 100 is configured as a p-type device. Accordingly, the source/drain features 500 include p-type semiconductor materials, such as Si, silicon germanium (SiGe), germanium (Ge), or combinations thereof. Moreover, the source/drain features 500 may further include a p-type dopant element, such as boron (B), boron fluoride ($BF_2$), gallium (Ga), other suitable p-type dopants, or combinations thereof.

Figure 12C:
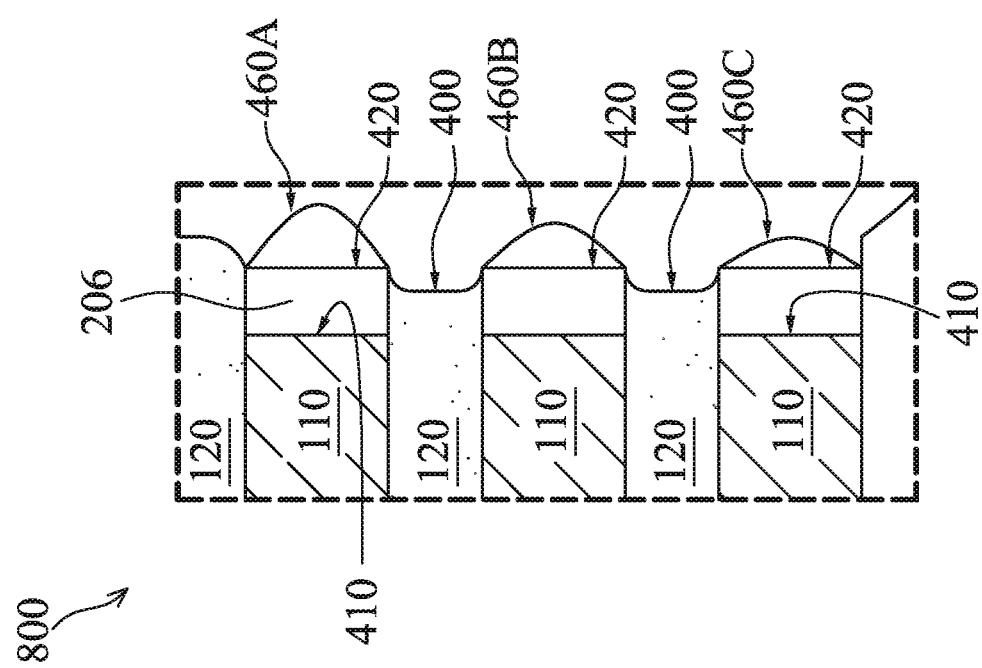
Figure 13:
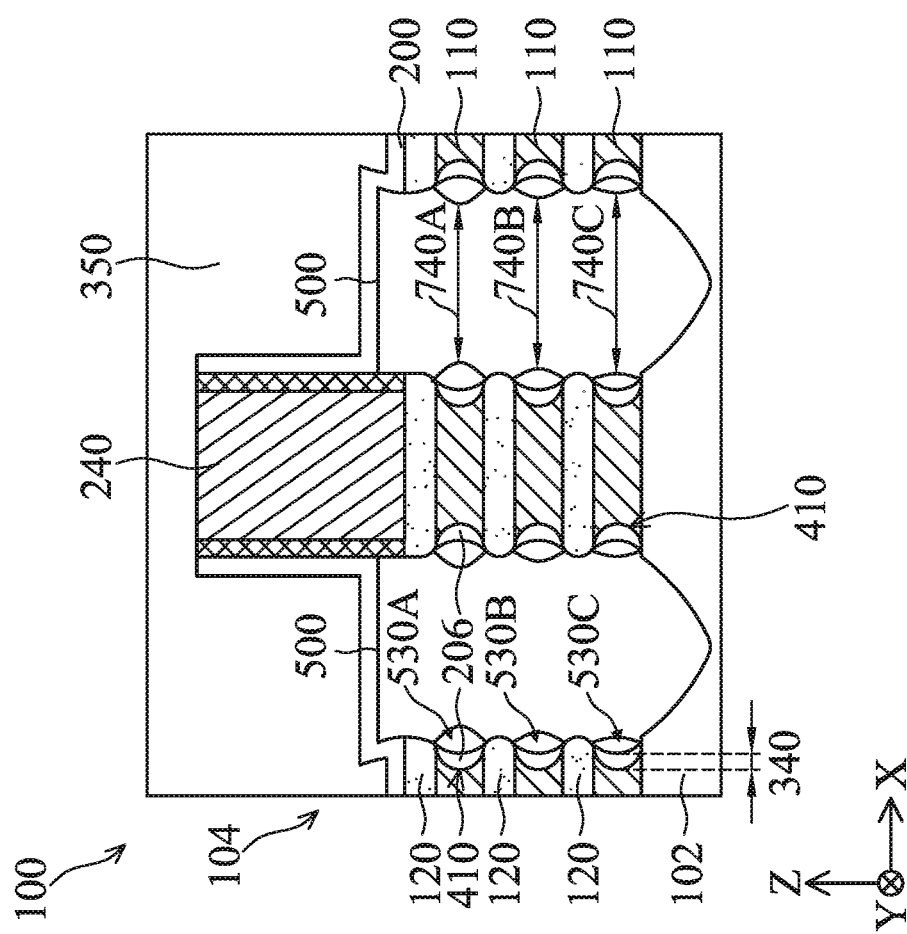
Figure 14:
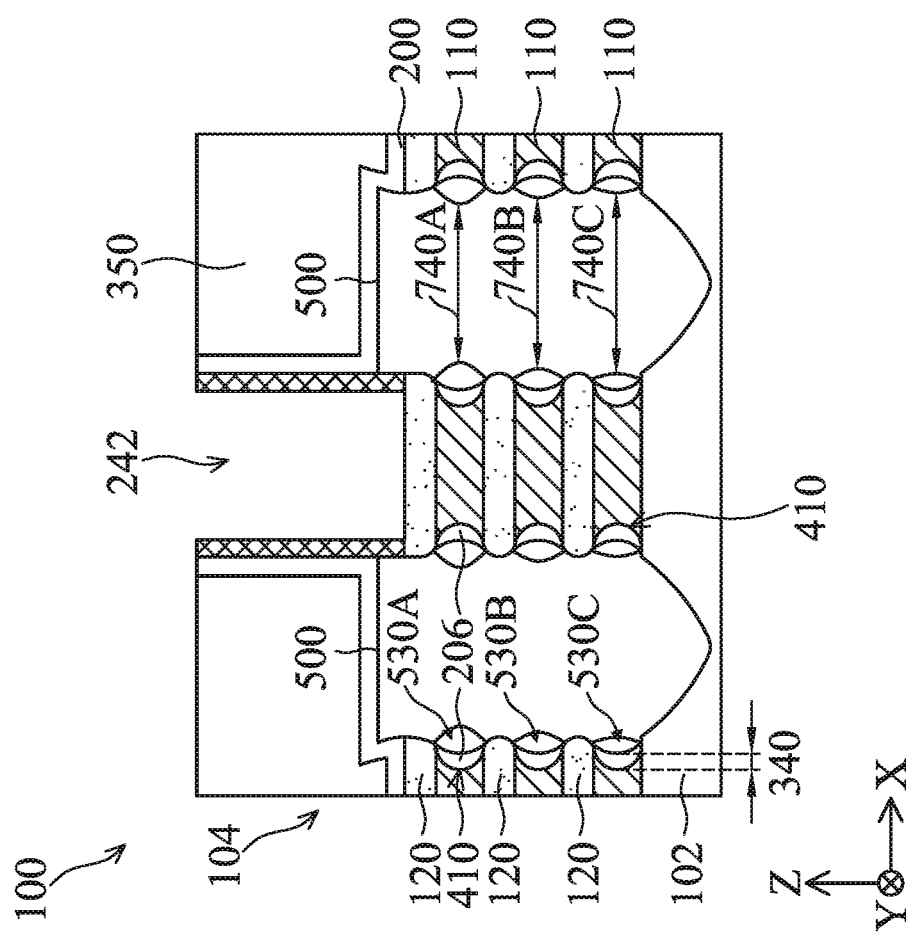
Figure 15:
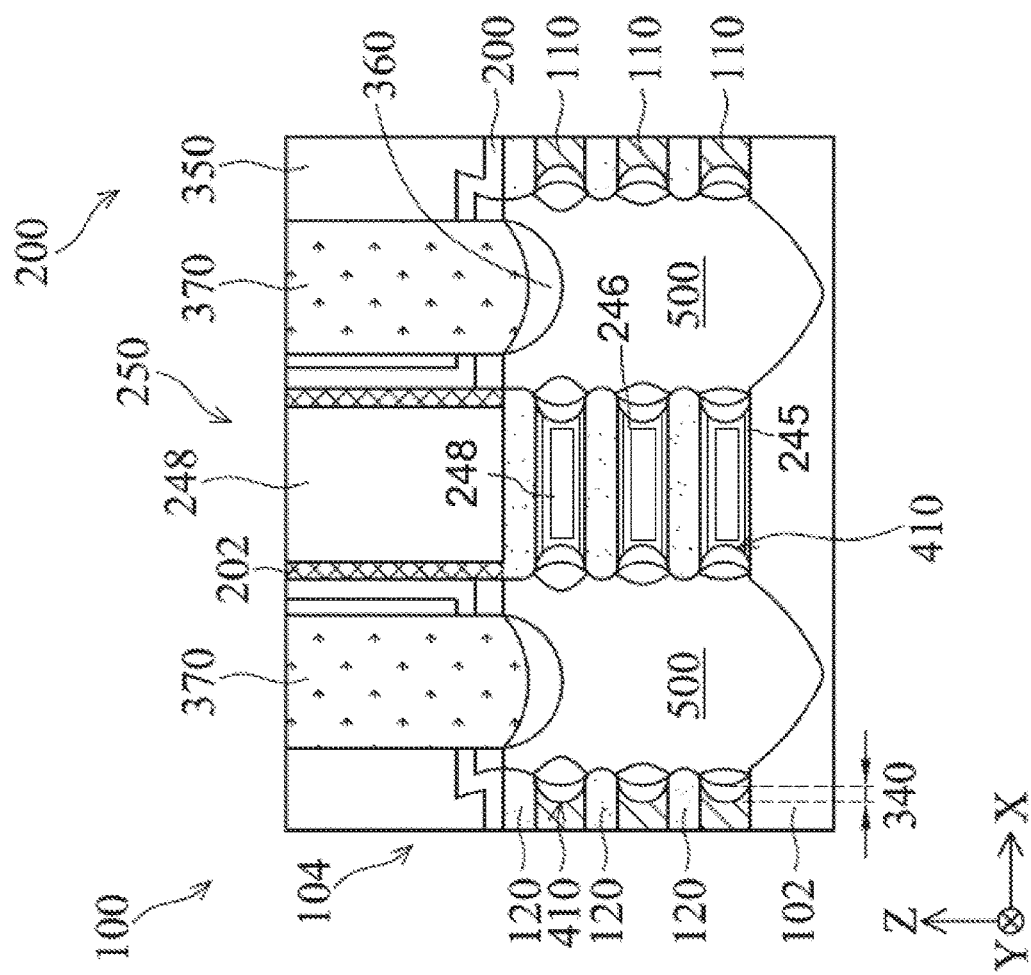

As described above, the profile and the sizes of the air gaps 530A-530C are defined by the profiles of the sidewall surfaces 420 and 460A-460C, respectively. Although the disclosure above illustrates certain profiles for the sidewall surfaces 420, other alternatively profiles are also contemplated. Moreover, profiles of the sidewall surfaces 410 of the remaining portions of the semiconductor layers 110 and the profiles of the semiconductor layers 120 may also be modified without departing from the spirits of the present disclosure. Referring to FIGS. 12A-12C, several alternative embodiments are presented. For example, FIG. 12A illustrates the inner spacers 206 having a sidewall surface 420 that is substantially straight vertically (or flat). Accordingly, the lateral sizes of the inner spacers 206 along the X-direction may be greater than those depicted in FIG. 10A. In some circumstances, having thicker inner spacers 206 may provide better protection to the source/drain features 500 in a subsequent channel release process. FIG. 12B illustrates inner spacers 206 having sidewall surface 410 that is also substantially straight. In other words, the inner spacers 206 have substantially equal lateral dimensions along their height dimensions. In some embodiments, this configuration provides uniform protection towards the source/drain features in the subsequent channel release processes, without leaving certain weak spots particularly prone to damage. Accordingly, the processing window for channel release process may be enlarged. FIG. 12C illustrates yet another example, where the semiconductor layers 120 may be configured to provide a concave surface facing the source/drain features 500. In some embodiments, this configuration allows a shorter migration path for the charge carriers during operation, thereby reducing the resistances. Additional or alternative configurations are possible for the inner spacers 206 and the air gaps 530A-530C, and are contemplated by the present disclosure. FIGS. 13-15 illustrate subsequent processes using the embodiments shown in FIGS. 9, 10, and 11A-11B as an example. Similar processes may be implemented for embodiments shown in FIGS. 12A-12C as well.

Referring to block 28 of FIG. 2B and FIG. 13, an interlayer dielectric (ILD) layer 350 is formed over the epitaxial source/drain features 500, as well as vertically over the isolation features 150. In some embodiments, an etch-stop layer 220 may be formed in between the ILD layer 350 and the source/drain features 500. The ILD layer 350 may also be formed in between the adjacent gate structures 250 along the X-direction, and in between the adjacent epitaxial source/drain features 500 along the Y-direction. The ILD layer 350 may include a dielectric material, such as a high-k material, a low-k material, or an extreme low-k material. For example, the ILD layer 350 may include $SiO_2$, SiOC, SiON, or combinations thereof. The ILD layer 350 may include a single layer or multiple layers, and may be formed by a suitable technique, such as CVD, ALD, and/or spin-on techniques. After forming the ILD layer 350, a CMP process may be performed to remove excessive ILD layer 350 and planarized the top surface of the ILD layer 350. Among other functions, the ILD layer 350 provides electrical isolation between the various components of the device 100.

Referring to block 30 of FIG. 2B and FIG. 14, the dummy gate stacks 240 are selectively removed. The removal of the dummy gate stacks 240 creates gate trenches 242, which expose the respective top surfaces and the side surfaces of the semiconductor stacks (along the Y direction). The removal processes may be selected from any suitable lithography and etching processes. In some embodiments, the lithography process may include forming a photoresist layer (resist), exposing the resist to a patterned radiation, performing a post-exposure bake process, and developing the resist to form a masking element, which exposes a region including the gate structures 250. Then, the dummy gate stacks 240 are selectively etched through the masking element. In some other embodiments, the gate spacer layers 202 may be used as the masking element or a part thereof.

Referring to blocks 32 of FIG. 2B and FIG. 15, the remaining portions of the semiconductor layers 110 are selectively removed through the exposed side surfaces of the semiconductor stack. Similar to processes 620, this process may be configured to completely remove the semiconductor layers 110 without substantially affect the semiconductor layers 120. Nevertheless, the semiconductor layers 120 may be slightly affected during the process. For example, the center of the semiconductor layers 120 may have their thicknesses reduced by about 1% to about 10%. The removal of the remaining portions of the semiconductor layers 110 form suspended semiconductor layers 120, as well as openings in between the vertically adjacent semiconductor layers 120. Accordingly, the center portions of the semiconductor layers 120 each have exposed top, bottom, and sidewall surfaces. In other words, the center portions of each of the semiconductor layers 120 are now exposed circumferentially around the X-direction. The semiconductor layers 120 are now "suspended" semiconductor layers 120. This process may implement any suitable etching methods, such as a dry etching method, a wet etching method, or combinations thereof. In addition to exposing top and bottom surfaces of the center portions of the semiconductor layers 120, the processes also expose the sidewall surfaces 460 of the inner spacers 206.

Referring to block 34 of FIG. 2B and FIG. 15, metal gate stacks are formed in the gate trenches 242 and openings between suspended semiconductor layers 120. For example, a gate dielectric layer 246 is formed over and between the semiconductor layers 120, and a conductive metal layer 248 is formed over and between the portions of the gate dielectric layers 246. In some embodiments, the gate dielectric layer 246 may be a high-k dielectric layer. The high-k gate dielectric layer 246 may be formed conformally such that it at least partially fills the gate trenches 242 and the openings. In some embodiments, the high-k gate dielectric layer 246 may be formed around the exposed surfaces of each of the semiconductor layers 120, such that it wraps around each of the semiconductor layers 120 in 360°. The high-k gate dielectric layer 246 may further be formed over the side surfaces 410 of the inner spacers 206, and the gate spacer layers 202. The high-k gate dielectric layer 246 may contain a dielectric material having a dielectric constant greater than a dielectric constant of $SiO_2$, which is approximately 3.9.

For example, the high-k gate dielectric layer 246 may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 246 may be by any suitable processes, such as CVD, PVD, ALD, or combinations thereof.

In some embodiments, an interfacial layer 245 is formed to interpose between the semiconductor layers 120 and the gate dielectric layers 246. Any suitable methods may be used to form the interfacial layer, such as ALD, CVD, or other deposition methods. Alternatively, the interfacial layer 245 may also be formed by an oxidation process, such as thermal oxidation or chemical oxidation. In this instance, no interfacial layer is formed on the sidewalls of the inner spacers 206 or the gate spacer layers 202. In many embodiments, the interfacial layer 245 improves the adhesion between the semiconductor substrate and the subsequently formed high-k gate dielectric layer 246. However, in some embodiments, the interfacial layer 245 is omitted.

The conductive metal layer 248 is formed over the gate dielectric layer 246 and fills the remaining spaces of the gate trenches 242 and the openings between suspended semiconductor layers 120. The conductive metal layer 248 may include a work function metal layer. In some embodiments, the conductive metal layer 248 is configured for the NMOS transistor. Accordingly, the work function metal layer may include any suitable n-type work function metal materials, such as titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. In some embodiment, the conductive metal layer 248 is configured for the PMOS transistor. Accordingly, the work function metal layer may include any suitable p-type work function metal materials, such as titanium nitride (TiN), ruthenium (Ru), iridium (Ir), osmium (Os), rhodium (Rh), or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 350. The gate dielectric layer 246 and the conductive metal layer 248 collectively form the high-k metal gate stack. The high-k metal gate stack and the gate spacer layers 202 collectively form the new gate structures 250. The gate structures 250 engage multiple semiconductor layers 120 to form multiple gate channels.

Referring to block 36 of FIG. 2B and to FIG. 15, contact trenches are formed over the epitaxial source/drain features 500 in the ILD layer 350. Subsequently, a silicide feature 360 (or silicide layer 360) is formed in the contact trench and on the epitaxial source/drain features 500. Silicide features 360 may reduce Schottky barrier height and thereby reduce the contact resistances between the source/drain features and the subsequently formed contact features. In the depicted embodiments, the silicide features 360 interface with the source/drain features 500. The silicide features 360 may be formed using any suitable methods, such as self-aligned silicide method, other suitable methods, or combinations thereof. In some embodiments, the silicide features 360 have a concave surface. In some embodiments, the silicide features 360 are omitted. Furthermore, source/drain contacts 370 are formed over the silicide features 360. The source/drain contacts 370 may include any suitable contact materials, such as tungsten (W), cobalt (Co), aluminum (Al), copper (Cu), or combinations thereof.

Referring to block 38 of FIG. 2B, method 10 may proceed to additional steps and to form additional features. For example, via features, metal lines, passivation features, etc. may be formed on the device 100. Method 10 above describes example methods of the present disclosure. Processing steps may be added to or eliminated from the methods 10 before or after any of the described steps. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100.

Different embodiments may provide different benefits, and not all benefits are required for any specific embodiment. In an exemplary aspect, the present disclosure is directed to a semiconductor device. The semiconductor device includes a source/drain feature over a semiconductor substrate, channel layers over the semiconductor substrate and connected to the source/drain feature, a gate portion between vertically adjacent channel layers, and an inner spacer between the source/drain feature and the gate portion and between adjacent channel layers. The semiconductor device further includes an air gap between the inner spacer and the source/drain feature.

In some embodiments, the inner spacer has a sidewall surface facing the source/drain feature, and where at least half of the sidewall surface of the inner spacer is exposed in the air gap. In some embodiments, the air gap extends vertically from a bottom surface of a first layer of the channel layers to a top surface of a second layer of the channel layers. In some embodiments, the inner spacer is a first inner spacer and the air gap is a first air gap. The semiconductor device further includes a second inner spacer between the semiconductor substrate and the first inner spacer, and a third inner spacer above the first inner spacer. Moreover, the semiconductor device further includes a second air gap between the second inner spacer and the source/drain feature, and a third air gap between the third inner spacer and the source/drain feature. In some embodiments, the first air gap has a first dimension between the first inner spacer and the source/drain feature, the second air gap has a second dimension between the second inner spacer and the source/drain feature, and the third air gap has a third dimension between the third inner spacer and the source/drain feature. The first dimension is greater than the second dimension but less than the third dimension. In some embodiments, the source/drain feature has a first surface exposed in the first air gap, a second surface exposed in the second air gap, and a third surface exposed in the third air gap. Moreover, the first surface has a first curvature, the second surface has a second curvature, and the third surface has a third curvature, where the first curvature is greater than the second curvature but less than the third curvature. In some embodiments, the gate portion is a first gate portion. The semiconductor device further includes a second gate portion between the first gate portion and the semiconductor substrate and a third gate portion above the first gate portion. Moreover, the source/drain feature has a first lateral size at a mid-height level of the second gate portion, a second lateral size at a mid-height level of the first gate portion, and a third lateral size at a mid-height level of the third gate portion. The first lateral size is greater than the second lateral size, and the second lateral size is greater than the third lateral size. In some embodiments, the air gap has a lateral gap dimension of about 1 nm to about 5 nm.

In an exemplary aspect, the present disclosure is directed to a semiconductor device. The semiconductor device includes a semiconductor substrate, a first semiconductor layer above the semiconductor substrate and extending in parallel to the semiconductor substrate, a second semiconductor layer above the first semiconductor layer and extending in parallel to the first semiconductor layer, a gate portion vertically between the first semiconductor layer and the second semiconductor layer, a source/drain feature connected to the first semiconductor layer and the second semiconductor layer, a spacer between the source/drain feature and the gate portion, and an air gap on a sidewall surface of the spacer.

In some embodiments, the air gap exposes a portion of the source/drain feature. In some embodiments, the air gap has a vertical dimension along a first direction perpendicular to the semiconductor substrate. The vertical dimension is about the same as a vertical separation between the first semiconductor layer and the second semiconductor layer. In some embodiments, the spacer is on a first side of the source/drain feature, and the device further includes another spacer on a second side of the source/drain feature opposite to the spacer along a direction parallel to the semiconductor substrate. The spacer is separated from the another spacer by a first distance by the source/drain feature at a first height. Moreover, the source/drain feature has a first lateral width at the first height, where the first distance is greater than the first lateral width. In some embodiments, the spacer is a first spacer and the air gap is a first air gap. The device further includes a second spacer between the first spacer and the semiconductor substrate, and a second air gap between the second spacer and the source/drain feature. The second air gap has a size smaller than a size of the first air gap. In some embodiments, the first air gap has a sidewall of a first curvature, the second air gap has a sidewall of a second curvature, and the first curvature is greater than the second curvature. In some embodiments, the device further comprises a third spacer above the second semiconductor layer and a third air gap between the third spacer and the source/drain feature. The third air gap has a size greater than the size of the first air gap. In some embodiments, the first air gap has a sidewall of a first curvature, the third air gap has a sidewall of a third curvature, and the third curvature is greater than the first curvature.

In an exemplary aspect, the present disclosure is directed to a method. The method includes receiving a semiconductor substrate, and forming a stack of first semiconductor layers and second semiconductor layers over the semiconductor substrate. The first semiconductor layers and the second semiconductor layers have different material compositions. The method also includes forming a gate structure over the stack, removing portions of the stack on two sides of the gate structure to form source/drain trenches, removing end portions of the first semiconductor layers to form first gaps between adjacent second semiconductor layers, forming inner spacers in the first gaps. The method further includes selecting a growth condition for source/drain features to minimize a size of an interface between the source/drain features and the inner spacers. The method additionally includes growing the source/drain features in the source/drain trenches using the selected growth condition.

In some embodiments, the selecting of the growth condition includes selecting a deposition flow rate for a selective epitaxial growth (SEG) process and selecting an etch flow rate for the SEG process, where a ratio of the deposition flow rate to the etch flow rate is about 1:1 to about 20:1. In some embodiments, the growing of the source/drain features includes growing without forming the source/drain feature on the inner spacers. In some embodiments, the growing includes forming air gaps each exposing at least half of a sidewall surface of a respective inner spacer of the inner spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a semiconductor substrate;
   forming a stack of first semiconductor layers and second semiconductor layers over the semiconductor substrate, the first semiconductor layers and the second semiconductor layers having different material compositions;
   forming a gate structure over the stack;
   removing portions of the stack on two sides of the gate structure to form source/drain trenches;
   removing end portions of the first semiconductor layers to form first gaps between adjacent second semiconductor layers;
   forming inner spacers in the first gaps; and
   growing source/drain features in the source/drain trenches using a selective epitaxial growth (SEG) process, the SEG process includes a deposition operation and an etching operation, the deposition operation includes depositing silicon using a silicon-containing chemical with a first flow rate, the etching operation includes applying an etchant chemical at a second flow rate, and a ratio of the first flow rate to the second flow rate is greater than 1,
   wherein the SEG process includes simultaneously performing the deposition operation and the etch operation, and the SEG process forms air gaps between the source/drain features and the inner spacers, wherein each of the air gaps expose at least half of a sidewall surface of a respective inner spacer of the inner spacers,
   wherein the inner spacers include a first inner spacer, a second inner spacer over the first inner spacer, and a third inner spacer over the second inner spacer,
   wherein a source/drain feature of the source/drain features includes a first curved surface exposed in a first air gap between the first inner spacer and the source/drain feature, a second curved surface exposed in a second air gap between the second inner spacer and the source/drain feature, and a third curved surface exposed in a third air gap between the third inner spacer and the source/drain feature,
   wherein the first curved surface includes an apex at a mid-height of the first air gap, the second curved surface includes an apex at a mid-height of the second air gap, and the third curved surface includes an apex at a mid-height of the third air gap, wherein the third curved surface has a greater curvature than the second curved surface, and the second curved surface has a greater curvature than the first curved surface.

2. The method of claim 1, wherein portions of the source/drain feature extend laterally such that the portions of the source/drain feature are vertically between the first and the second inner spacers and between the second and the third inner spacers.

3. The method of claim 1, wherein the deposition operation implements dichlorosilane (DCS) as the silicon-containing chemical at a flow rate of at least about 600 sccm.

4. The method of claim 1, wherein the etch operation implements hydrogen chloride as the etchant chemical at a flow rate of at least about 200 sccm.

5. The method of claim 1, wherein a ratio of the first flow rate to the second flow rate is about 2:1 to about 10:1.

6. The method of claim 1, wherein the growing of the source/drain features includes growing without forming the source/drain features on the inner spacers.

7. The method of claim 1, wherein the inner spacers are formed to have curved sidewall surfaces.

8. The method of claim 7, wherein the air gaps formed between a topmost inner spacer and the source/drain features are larger than air gaps formed between a bottommost inner spacer and the source/drain features.

9. The method of claim 8 wherein the source/drain features have a first curved sidewall surface opposing a topmost first semiconductor layer and a second curved sidewall surface opposing a bottommost first semiconductor layer, wherein the first curved sidewall surface has a greater curvature than the second curved sidewall surface.

10. A method, comprising:
receiving a semiconductor substrate;
forming a stack of first semiconductor layers and second semiconductor layers over the semiconductor substrate, the first semiconductor layers and the second semiconductor layers having different material compositions;
forming a gate structure over the stack;
removing portions of the stack on two sides of the gate structure to form source/drain trenches;
removing end portions of the first semiconductor layers to form first gaps between adjacent second semiconductor layers;
forming inner spacers in the first gaps; and
forming source/drain features in the source/drain trenches such that the source/drain features are grown from the semiconductor substrate and the first semiconductor layers while minimizing a size of an interface between the source/drain features and the inner spacers,
wherein multiple sidewall surfaces of the source/drain features curve inwards towards a center of the source/drain features, wherein the multiple sidewall surfaces include concave sidewalls exposed in air gaps,
wherein a first concave sidewall is exposed in a bottommost air gap and includes an apex at a mid-height of the bottommost air gap, a second concave sidewall is exposed in a middle air gap above the bottommost air gap and includes an apex at a mid-height of the middle air gap, and a third concave sidewall is exposed in a topmost air gap above the middle air gap and includes an apex at a mid-height of the topmost air gap,
wherein the third concave sidewall has a greater curvature than the second concave sidewall, and the second concave sidewall has a greater curvature than the first concave sidewall.

11. The method of claim 10, wherein the air gaps span between the inner spacers and the multiple sidewall surfaces of the source/drain features.

12. The method of claim 10, wherein a vertical dimension of the air gaps is substantially the same as a vertical dimension of the first semiconductor layers.

13. The method of claim 10, wherein the forming of the source/drain features includes performing a cyclic deposition/etch (CDE) process that iteratively and separately deposits the source/drain features and etches the source/drain features.

14. The method of claim 10, wherein the forming of the source/drain features includes performing a selective epitaxial growth (SEG) process that simultaneously deposits the source/drain features using a dichlorosilane precursor with a first flow rate and etches the source/drain features using a hydrogen chloride etchant with a second flow rate, wherein a ratio of the first flow rate to the second flow rate is greater than 1.

15. The method of claim 10, wherein the inner spacers have a sidewall surface that curves inwards towards the first semiconductor layers.

16. A method, comprising:
receiving a semiconductor substrate;
forming a stack of first semiconductor layers and second semiconductor layers over the semiconductor substrate, the first semiconductor layers and the second semiconductor layers having different material compositions;
forming a gate structure over the stack;
removing portions of the stack on two sides of the gate structure to form source/drain trenches;
removing end portions of the first semiconductor layers to form first gaps between adjacent second semiconductor layers;
forming inner spacers in the first gaps; and
selectively growing source/drain features in the source/drain trenches to minimize forming source/drain features on sidewall surfaces of the inner spacers,
wherein the selectively growing includes depositing source/drain features using a dichlorosilane precursor with a first flow rate and etching the source/drain features using a hydrogen chloride etchant with a second flow rate, wherein a ratio of the first flow rate to the second flow rate is about 2:1 to about 10:1,
wherein the inner spacers include first inner spacers between the source/drain features and bottommost first semiconductor layers, second inner spacers between the source/drain features and middle first semiconductor layers, and third inner spacers between the source/drain features and topmost first semiconductor layers,
wherein the source/drain features have first curved surfaces exposed in first air gaps between the first inner spacers and the source/drain features, second curved surfaces exposed in second air gaps between the second inner spacers and the source/drain features, and third curved surfaces exposed in third air gaps between the third inner spacers and the source/drain features,
wherein the first curved surface includes an apex at a mid-height of the first air gaps, the second curved surface includes an apex at a mid-height of the second air gaps, and the third curved surface includes an apex at a mid-height of the third air gaps, wherein the third curved surfaces have a greater curvature than the second curved surfaces, and the second curved surfaces have a greater curvature than the first curved surfaces.

17. The method of claim 16, wherein the selectively growing of the source/drain features includes performing a cyclic deposition/etch (CDE) process that iteratively and separately deposits the source/drain features and etches the source/drain features.

18. The method of claim 16, wherein the selectively growing of the source/drain features includes performing a selective epitaxial growth (SEG) process that simultaneously deposits the source/drain features using a dichlorosilane precursor with a first flow rate and etches the source/drain features using a hydrogen chloride etchant with a second flow rate, wherein a ratio of the first flow rate to the second flow rate is about 2:1 to about 10:1.

19. The method of claim 1, wherein each of the first, second, and third air gaps has a height less than a vertical spacing between the first semiconductor layers, and the source/drain features are formed to directly contact a portion of each of the first, second, and third inner spacers.

20. The method of claim 16,
wherein the third air gaps have a greater lateral size than the second air gaps, and the second air gaps have a greater lateral size than the first air gaps.

* * * * *